(12) United States Patent
Li et al.

(10) Patent No.: US 11,239,946 B2
(45) Date of Patent: Feb. 1, 2022

(54) DATA ENCODING METHOD AND DEVICE, STORAGE MEDIUM, AND PROCESSOR

(71) Applicant: ZTE Corporation, Guangdong (CN)

(72) Inventors: Liguang Li, Guangdong (CN); Jun Xu, Guangdong (CN); Jin Xu, Guangdong (CN)

(73) Assignee: ZTE Corporation, Shenzhen (CN)

( * ) Notice: Subject to any disclaimer, the term of this patent is extended or adjusted under 35 U.S.C. 154(b) by 66 days.

(21) Appl. No.: 16/787,009

(22) Filed: Feb. 10, 2020

(65) Prior Publication Data

US 2020/0304235 A1 Sep. 24, 2020

Related U.S. Application Data

(63) Continuation of application No. PCT/CN2018/095037, filed on Jul. 9, 2018.

(30) Foreign Application Priority Data

Aug. 11, 2017 (CN) .......................... 201710687764.6

(51) Int. Cl.
*H04L 1/00* (2006.01)
*H04L 1/18* (2006.01)

(52) U.S. Cl.
CPC .......... *H04L 1/0057* (2013.01); *H04L 1/0013* (2013.01); *H04L 1/0041* (2013.01); *H04L 1/0071* (2013.01); *H04L 1/1819* (2013.01)

(58) Field of Classification Search
CPC .......... H03M 13/116; H03M 13/2707; H03M 13/6306; H03M 13/635; H04L 1/0013;
(Continued)

(56) References Cited

U.S. PATENT DOCUMENTS

2008/0282125 A1* 11/2008 Hafeez .................. H04L 1/1845
714/748
2011/0161772 A1 6/2011 Yoshii et al.
(Continued)

FOREIGN PATENT DOCUMENTS

CN 101188428 A 5/2008
CN 102075196 A 5/2011
(Continued)

OTHER PUBLICATIONS

International Search Report and Written Opinion dated Sep. 18, 2018 for International Application No. PCT/CN2018/095037, filed on Jul. 9, 2018 (8 pages).
(Continued)

*Primary Examiner* — Oussama Roudani
(74) *Attorney, Agent, or Firm* — Perkins Coie LLP (57) ABSTRACT

Provided are a data encoding method and device, a storage medium, and a processor. The method includes: obtaining data to be sent; performing quasi-cyclic low-density parity check (LDPC) encoding on the data to be sent to obtain an LDPC codeword sequence, and interleaving the LDPC codeword sequence to obtain an interleaved LDPC codeword sequence; performing cyclic bit selection on the interleaved LDPC codeword sequence from a starting position to obtain a rate-matched codeword sequence, where the starting position is determined according to a predetermined parameter; and sending the rate-matched codeword sequence. The solution above resolves the problem in the related art of unstable transmission after performing quasi-cyclic LDPC encoding on data to be transmitted, and achieves stable transmission after the quasi-cyclic LDPC encoding.

20 Claims, 2 Drawing Sheets

(58) Field of Classification Search
CPC ... H04L 1/1819; H04L 1/0057; H04L 1/1874; H04L 1/0071; H04L 1/00; H04L 1/0041

See application file for complete search history.

(56) References Cited

U.S. PATENT DOCUMENTS

| | | | |
|---|---|---|---|
| 2011/0239075 A1 | 9/2011 | Xu et al. | |
| 2014/0372826 A1 | 12/2014 | Myung et al. | |
| 2018/0234114 A1* | 8/2018 | Soriaga | H04L 1/0041 |
| 2019/0132082 A1* | 5/2019 | Ma | H04L 1/0067 |
| 2019/0229751 A1* | 7/2019 | Kim | H03M 13/11 |
| 2020/0145142 A1* | 5/2020 | Yoshimura | H04L 1/0061 |

FOREIGN PATENT DOCUMENTS

| | | |
|---|---|---|
| CN | 105811996 A | 7/2016 |
| CN | 107026654 A | 8/2017 |
| EP | 3131219 A1 | 2/2017 |
| KR | 2014-0145977 A | 12/2014 |
| WO | 2005060141 A1 | 6/2005 |

OTHER PUBLICATIONS

LG Electronics, "On Rate Matching with LDPC Code for eMBB," 3GPP TSG RAN WG1 NR Ad-Hoc #2, Qingdao, P.R. China, R1-1710343, 4 pages, Jun. 2017.

ZTE "Consideration on coding chain for eMBB data channel," 3GPP TSG RAN WG1 Meeting #89, Hangzhou, China, May 15-19, 2017, R1-1707177, XP051272392, Retrieved from the Internet: URL:http://www.3gpp.org/ftp/Meetings_3GPP_SYNC/RAN1/Docs/, retrieved on May 14, 2017, 7 pages.

Nokia et al. "Interleaving for LDPC," 3GPP TSG RAN WG1 NR Ad-Hoc#2, Qingdao, P.R. China, Jun. 27-30, 2017, R1-1711538, XP051300722, Retrieved from the Internet: URL:http://www.3gpp.org/ftp/Meetings_3GPP_SYNC/RAN1/Docs/, retrieved on Jun. 26, 2017, 5 pages.

Huawei et al. "Rate matching for LDPC codes," 3GPP TSG RAN WG1 NR Ad-Hoc#2, Qingdao, China, Jun. 27-30, 2017, R1-1711438, XP051300624, Retrieved from the Internet: URL:http://www.3gpp.org/ftp/Meetings_3GPP_SYNC/RAN1/Docs/, retrieved on Jun. 26, 2017, 6 pages.

Supplementary European Search Report in EP Patent Application No. 18844354, dated Jul. 17, 2020, 2 pages.

* cited by examiner

DATA ENCODING METHOD AND DEVICE, STORAGE MEDIUM, AND PROCESSOR

CROSS-REFERENCES TO RELATED APPLICATIONS

This patent document is a continuation of and claims benefit of priority to International Patent Application No. PCT/CN2018/095037, filed on Jul. 9, 2018, which claims the benefit of priority of Chinese Patent Application No. 201710687764.6, filed on Aug. 11, 2017. The entire contents of the before-mentioned patent applications are incorporated by reference as part of the disclosure of this application.

TECHNICAL FIELD

The present invention relates to the field of communications and, in particular, to a data encoding method and device, a storage medium and a processor.

BACKGROUND

In the relate art, for the problem in which in a quasi-cyclic low-density parity-check (LDPC) encoding process, once more padding bits appear, an encoding or decoding efficiency of an LDPC code is reduced, a transport block size (TBS) table design rule is provided, such that there are as fewer as possible padding bits or no pad bit when the LDPC encoding is performed. For the problem of some cask effects caused by the fact that the number of code blocks in each code block group in a transport block may be different, a Kmax design method in a code block partition method is provided, such that the number of code blocks in each code block group is equal to avoid poor overall performance caused when some code block groups have more code blocks; and for the problem of poor performance of the quasi-cyclic LDPC encoding in a high-order modulation or a fading channel, the performance of the quasi-cyclic LDPC encoding is improved in a codeword interleaving method.

In an actual communication system, since the number of bits of a transport block that actually needs to be transmitted is not necessarily equal to a system bit length supported by a quasi-cyclic LDPC encoding basic matrix, code block partition needs to be performed on the transport block and bits need to be padded. However, the code block partition performed on the transport block and the padded bit will cause the problem of unstable transmission, such as reduction of the encoding and decoding rate, high energy consumption, and influence on robustness of data communication.

No effective solution to the problem of unstable transmission after performing quasi-cyclic LDPC encoding on data to be transmitted exists in the related art.

SUMMARY

Embodiments of the present invention provide a data encoding method and device, a storage medium, and a processor, to at least solve the problem in the related art of unstable transmission after performing quasi-cyclic LDPC encoding on data to be transmitted.

According to an embodiment of the present invention, a data encoding method is provided. The method includes: performing quasi-cyclic LDPC encoding on an information packet bit sequence to obtain an LDPC codeword sequence, and determining a size of a one-dimensional finite-length circular buffer according to the LDPC codeword sequence; selecting a redundancy version value from a plurality of predetermined redundancy version values, and determining a starting position for reading a bit sequence to be transmitted in the one-dimensional finite-length circular buffer according to the selected redundancy version value and a predefined parameter, where the predefined parameter includes at least one of: a lifting size, the total number of columns of a base graph matrix, the total number of rows of the base graph matrix, the number of system columns of the base graph matrix, or a length of the information packet bit sequence; and sequentially reading data bits with a specific length from the starting position to form a bit sequence to be transmitted, and sending the bit sequence to be transmitted.

According to another embodiment of the present invention, a data encoding device is further provided. The device includes: an obtaining module, which is configured to obtain data to be sent; an interleaving module, which is configured to perform quasi-cyclic LDPC encoding on the data to be sent to obtain an LDPC codeword sequence, and interleave the LDPC codeword sequence to obtain an interleaved LDPC codeword sequence; a selecting module, which is configured to perform cyclic bit selection on the interleaved LDPC codeword sequence from a starting position to obtain a rate-matched codeword sequence, where the starting position is determined according to a predetermined parameter, where the predetermined parameter includes at least one of: a redundancy version, a lifting size, the total number of columns of a base graph matrix, the total number of rows of the base graph matrix, the number of system columns of the base graph matrix or a length of an information packet bit sequence; and a sending module, which is configured to send the rate-matched codeword sequence.

According to another embodiment of the present invention, a storage medium is further provided. The storage medium includes stored programs which, when executed, execute the above-mentioned data encoding method.

According to another embodiment of the present invention, a processor is further provided. The processor is used for executing programs which, when executed, execute the above-mentioned data encoding method in the optional embodiments described above.

Through the present invention, data to be sent is obtained; quasi-cyclic LDPC encoding is performed on the data to be sent to obtain an LDPC codeword sequence, and the LDPC codeword sequence is interleaved to obtain an interleaved LDPC codeword sequence; cyclic bit selection is performed on the interleaved LDPC codeword sequence from a starting position to obtain a rate-matched codeword sequence, where the starting position is determined according to a predetermined parameter; and the rate-matched codeword sequence is sent. The solution above resolves the problem in the related art of unstable transmission after performing quasi-cyclic LDPC encoding on data to be transmitted, and achieves stable transmission after the quasi-cyclic LDPC encoding.

BRIEF DESCRIPTION OF DRAWINGS

The drawings described herein are used to provide a further understanding of the present invention and form a part of the present application. The exemplary embodiments and descriptions thereof in the present invention are used to explain the present invention and not to limit the present invention in any improper way. In the drawings.

DETAILED DESCRIPTION

Embodiments of the present application provide a mobile communication network (which includes, but is not limited to, a 5G mobile communication network). Network architecture of the network may include a network side device (such as a base station) and a terminal. An information transmission method executable on the network architecture is provided in the embodiment. It is to be noted that an execution environment of the information transmission method provided by the embodiments of the present application is not limited to the network architecture.

The related art of an encoding method in the digital communication system will be briefly described before the embodiments of the present invention are described in detail.

The digital communication system in the related art generally includes three parts: a transmitting end, a channel, and a receiving end. The transmitting end can perform channel encoding on an information sequence to obtain an encoded codeword, interleave the encoded codeword, and map interleaved bits into modulation symbols, and then process and transmit the modulation symbols according to communication channel information. In the channel, a specific channel response due to factors such as multipath and movement results in distorted data transmission, and noise and interference will further deteriorate the data transmission. The receiving end receives modulation symbol data after passing through the channel, where the modulation symbol data has already been distorted at this point, and needs to perform specific processing to restore the original information sequence.

According to an encoding method used by the transmitting end for encoding the information sequence, the receiving end can perform corresponding processing on the received data to reliably restore the original information sequence. Generally, the encoding method is based on forward error correction (FEC) encoding. The FEC encoding adds some redundant information to the information sequence, and the receiving end can reliably restore the original information sequence with the redundant information.

Some common FEC encoding includes: a convolutional code, a Turbo code, and an LDPC code. In the FEC encoding process, the FEC encoding is performed on an information sequence with the number k of bits to obtain an FEC encoded codeword with n bits (including n-k redundancy bits), and an FEC encoding rate is k/n. The LDPC code is a linear block code defined with a very sparse parity check matrix or a bipartite graph. The sparsity of the check matrix of the LDPC code helps achieve low-complexity encoding and decoding, thus making the LDPC more practical. Various practices and theories prove that the LDPC code has the best channel encoding performance which is very close to the Shannon limit under additive white Gaussian noise (AWGN). In the parity check matrix of the LDPC code, each row is a parity check code. If an element value of a position of a certain index is equal to 1 in each row, it means that the bit at this position participates in the parity check code; if the element value is equal to 0, it means that the bit at this position does not participate in the parity check code.

Due to structured characteristics, a quasi-cyclic LDPC code has become a mainstream application. For example, the quasi-cyclic LDPC code has been widely applied to IEEE802.11ac, IEEE802.11ad, IEEE802.11aj, IEEE802.16e, IEEE802.11n, microwave communications, and optical fiber communications, and is adopted as data channel encoding scheme in the 5th generation (5G) mobile communication. The parity check matrix H of the quasi-cyclic LDPC code is a matrix having M×Z rows and N×Z columns, which is composed of M×N sub-matrices. Each sub-matrix is a different power of a basic permutation matrix with the size of Z×Z, that is, each sub-matrix is obtained after a cyclic shift of several values of an identity matrix with the size of Z×Z.

To more easily describe the cyclic shift of the identity matrix from a mathematical perspective, the parity check matrix of the quasi-cyclic LDPC code can be written as the following mathematical formula.

$$H = \begin{bmatrix} P^{hb_{11}} & P^{hb_{12}} & P^{hb_{13}} & \ldots & P^{hb_{1N}} \\ P^{hb_{21}} & P^{hb_{22}} & P^{hb_{23}} & \ldots & P^{hb_{2N}} \\ \ldots & \ldots & \ldots & & \ldots \\ P^{hb_{M1}} & P^{hb_{M2}} & P^{hb_{M3}} & \ldots & P^{hb_{MN}} \end{bmatrix} = P^{Hb}$$

If $hb_{ij} = -1$, $P^{hb_{ij}}$ is an all-zero matrix with the size of Z×Z; otherwise, is a nonnegative integer power of a standard permutation matrix P. The standard permutation matrix P is written as follow.

$$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}$$

With this definition, Z and the power $hb_{ij}$ can uniquely identify each block matrix. If a certain block matrix is an all-zero matrix, the block matrix can be represented by "−1" or a null value or in other forms. If the block matrix is obtained through a cyclic shift of s of the identity matrix, the block matrix is equal to s. All $hb_{ij}$ can constitute a basic matrix Hb of the quasi-cyclic LDPC code, which can be written as follow.

$$Hb = \begin{bmatrix} hb_{11} & hb_{12} & hb_{13} & \ldots & hb_{1N} \\ hb_{21} & hb_{22} & hb_{23} & \ldots & hb_{2N} \\ \ldots & \ldots & \ldots & \ldots & \ldots \\ hb_{M1} & hb_{M2} & hb_{M3} & \ldots & hb_{MN} \end{bmatrix}$$

Therefore, the basic matrix Hb includes two types of elements: an element indicating an all-zero square matrix, and an element indicating a value of the cyclic shift of the identity matrix, which is generally represented by an integer within a range of 0 to (Z−1). The basic matrix Hb can be referred to as a basic check matrix or a shift value matrix or a permutation value matrix or a basic parity check matrix or a parity check matrix. In the basic matrix Hb, if the element indicating the all-zero matrix is replaced with an element "0", and other elements are replaced with elements, "1", a base graph matrix or a template matrix of the quasi-cyclic LDPC encoding can be obtained. The base graph matrix may also be described in a form of table. For example, row and column index pairs are used for indicating positions of "1" of the base graph matrix or positions of elements indicating a value of the cyclic shift of the identity matrix in the basic matrix. Therefore, the basis matrix of the quasi-cyclic LDPC code can be determined according to the template matrix of the quasi-cyclic LDPC code and a group of shift values (or coefficients). The dimension Z of the basic permutation matrix or the all-zero square matrix can be defined as a shift size/lifting size or an expansion factor or a submatrix size.

Therefore, a structured LDPC code can be uniquely determined by the basic check matrix Hb and the lifting size Z. For example, the basic matrix Hb (with 2 rows and 4 columns) corresponds to the lifting size z of 4 and is written as follow.

$$Hb = \begin{bmatrix} 0 & 1 & 0 & -1 \\ 2 & 1 & 2 & 1 \end{bmatrix}$$

The template matric corresponding to the basic matrix Hb is written as follow.

$$BG = \begin{bmatrix} 1 & 1 & 1 & 0 \\ 1 & 1 & 1 & 1 \end{bmatrix}$$

The parity check matrix H obtained according to the basic matrix Hb and the lifting size Z is written as follow.

$$H = \begin{bmatrix} 1 & 0 & 0 & 0 & | & 0 & 1 & 0 & 0 & | & 1 & 0 & 0 & 0 & | & 0 & 0 & 0 & 0 \\ 0 & 1 & 0 & 0 & | & 0 & 0 & 1 & 0 & | & 0 & 1 & 0 & 0 & | & 0 & 0 & 0 & 0 \\ 0 & 0 & 1 & 0 & | & 0 & 0 & 0 & 1 & | & 0 & 0 & 1 & 0 & | & 0 & 0 & 0 & 0 \\ 0 & 0 & 0 & 1 & | & 1 & 0 & 0 & 0 & | & 0 & 0 & 0 & 1 & | & 0 & 0 & 0 & 0 \\ - & - & - & - & - & - & - & - & - & - & - & - & - & - & - & - & - & - & - \\ 0 & 0 & 1 & 0 & | & 0 & 1 & 0 & 0 & | & 0 & 0 & 1 & 0 & | & 0 & 1 & 0 & 0 \\ 0 & 0 & 0 & 1 & | & 0 & 0 & 1 & 0 & | & 0 & 0 & 0 & 1 & | & 0 & 0 & 1 & 0 \\ 1 & 0 & 0 & 0 & | & 0 & 0 & 0 & 1 & | & 1 & 0 & 0 & 0 & | & 0 & 0 & 0 & 1 \\ 0 & 1 & 0 & 0 & | & 1 & 0 & 0 & 0 & | & 0 & 1 & 0 & 0 & | & 1 & 0 & 0 & 0 \end{bmatrix}$$

The quasi-cyclic LDPC encoding can be directly performed according to the parity check matrix determined according to the basic matrix Hb and the lifting size Z. According to the definition of the LDPC code, H×C=0 is satisfied; the H includes [Hs Hp], where Hs is a matrix of a system column part of the parity check matrix and Hp is a matrix of a check column part of the parity check matrix; the C can include [Cs Cp], where Cs is a system bit sequence (an information bit, a known bit) of the LDPC code and Cp is a check bit sequence (a unknown bit) of the LDPC code. The LDPC encoding process is a process of calculating the check bit sequence. Therefore, Hs×Cs=Hp×Cp, and then the check bit sequence Cp can be calculated, that is, Cp=inv(Hp)×Hs×Cs, where the formula inv(x) represents binary inversion on a matrix x. Therefore, the matrix of check columns of the parity check matrix must be a square matrix and binary invertible, such that a quasi-cyclic LDPC encoded sequence is [Cs Cp]. Of course, the quasi-cyclic LDPC encoded sequence can also be calculated through the cyclic shift of each Z-bit block.

In the process of data transmission, the applicant finds that when the code block partition is performed on the transport block and bits are padded, for the LDPC code, the pad bits are used for assisting the encoding or decoding and dose not participate in the transmission actually, but in the process of encoding and decoding, if more pad bits appear, the encoder or the decoder will execute some useless operations, thereby reducing the encoding and decoding rate and causing high energy consumption. If the length of the transport block is large, the number of code blocks is large at this point. In order to facilitate feedback and improve a processing efficiency, all LDPC code blocks need to be divided in a plurality of code block group, where each code block group includes several LDPC coed blocks, and acknowledgement or negative acknowledgement (ACK/NACK) feedback is received and data retransmission is performed at the receiving end in the unit of code block groups. If the design of code block groups is not considered in the process of code block partition, the number of code blocks in each code block group will be different when the code blocks are divided into code block groups, which will cause some cask effects and affect the robustness of data communication. Since the quasi-cyclic LDPC encoding has certain structured characteristics, in some high-order modulations or fading channels, the LDPC code may have some problems related to poor performance. Therefore, the codeword bits need to be interleaved to randomize burst noise, thereby improving the performance of the quasi-cyclic LDPC codeword under the burst noise.

Embodiment One

Figure 1:
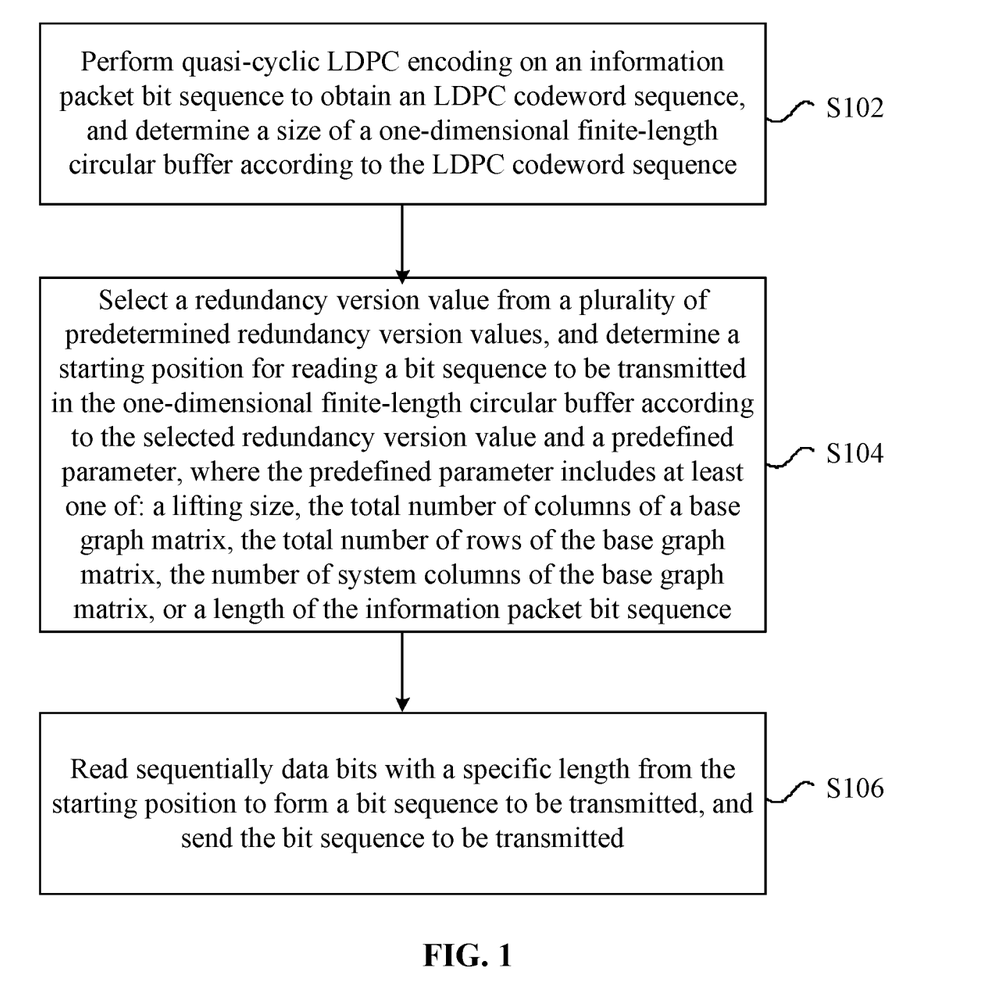
FIG. 1 is a flowchart of a data encoding method according to an embodiment of the present invention.

The embodiment provides a data encoding method. FIG. 1 is a flowchart of a data encoding method according to an embodiment of the present invention. As shown in FIG. 1, the method includes the steps described below.

In step S102, quasi-cyclic LDPC encoding is performed on an information packet bit sequence to obtain an LDPC codeword sequence, and a size of a one-dimensional finite-length circular buffer is determined according to the LDPC codeword sequence.

In step S104, a redundancy version value is selected from a plurality of predetermined redundancy version values, and a starting position for reading a bit sequence to be transmitted in the one-dimensional finite-length circular buffer is determined according to the selected redundancy version value and a predefined parameter, where the predefined parameter includes at least one of: a lifting size, the total number of columns of a base graph matrix, the total number of rows of the base graph matrix, the number of system columns of the base graph matrix, or a length of the information packet bit sequence.

In step S106, data bits with a specific length are sequentially read from the starting position to form a bit sequence to be transmitted, and the bit sequence to be transmitted is sent.

Through the above steps, quasi-cyclic LDPC encoding is performed on an information packet bit sequence to obtain an LDPC codeword sequence, and a size of a one-dimensional finite-length circular buffer is determined according to the LDPC codeword sequence; a redundancy version value is selected from a plurality of predetermined redundancy version values, and a starting position for reading a bit sequence to be transmitted in the one-dimensional finite-length circular buffer is determined according to the selected redundancy version value and a predefined parameter, where the predefined parameter includes at least one of: a lifting size, the total number of columns of a base graph matrix, the total number of rows of the base graph matrix, the number of system columns of the base graph matrix, or a length of the information packet bit sequence; and data bits with a specific length are sequentially read from the starting position to form a bit sequence to be transmitted, and the bit sequence to be transmitted is sent. The solution above resolves the problem in the related art of unstable transmission after performing quasi-cyclic LDPC encoding on data to be transmitted, and achieves stable transmission after the quasi-cyclic LDPC encoding.

In one embodiment, the above steps may, but are not limited to, be executed by a base station or a terminal.

In one embodiment, the LDPC codeword sequence is interleaved to obtain an interleaved LDPC codeword sequence, and this step includes: performing block interleaving on the LDPC codeword sequence, where the number of rows of the interleaving matrix is determined according to the quasi-cyclic LDPC encoding parameter, and the quasi-cyclic LDPC encoding parameter includes at least one of: a lifting size, the total number of columns of a base graph matrix, the total number of rows of the base graph matrix, or the number of system columns of the base graph matrix. The interleaving matrix is interleaved in a manner in which data in the matrix is inputted along the column and outputted along the column.

In one embodiment, the number of rows of the interleaving matrix is equal to a positive integer factor of the quasi-cyclic LDPC lifting size, or is equal to a positive integer multiple of a lifting size of the quasi-cyclic LDPC encoding.

In one embodiment, the number of rows of the interleaving matrix is equal to a positive integer factor of the total number of columns of the base graph matrix of the quasi-cyclic LDPC encoding, or is equal to a positive integer multiple of the total number of columns of the base graph matrix of the quasi-cyclic LDPC encoding.

In one embodiment, the interleaving method further includes: performing outputting respectively according to a predetermined column order to obtain the interleaved codeword sequence.

In one embodiment, the intra-column interleaving method is determined according to a modulation order.

Optionally, in condition that the modulation order is greater than M0, the intra-column interleaving method is executed, where the M0 is an integer greater than 1.

In one embodiment, the starting position is determined according to the redundancy version, the lifting size and the total number of columns of the base graph matrix.

In one embodiment, the starting position corresponding to the redundancy version being $RV_i$ is calculated via the following formula:

$$S_i = \alpha \times \text{function}(\beta \times (nb/G) \times RV_i + \chi) \times Z + \delta; \quad \text{a first formula}$$

where, in the first formula, the nb is the total number of columns of the base graph matrix, Z is the lifting size, α is a positive integer, G is a real number greater than 0, β is a positive real number, χ is a nonnegative real number, and δ is an integer, where the function(x) represents rounding the real number x up to, or down to, or to a nearest integer;

or $$S_i = \alpha \times (\beta \times \text{function}(\lambda \times nb/G) \times RV_i + \chi) \times Z + \delta; \quad \text{a second formula}$$

where, in the second formula, the nb is the total number of columns of the base graph matrix, Z is the lifting size, α is a positive integer, G is a real number greater than 0, β is a positive integer, the λ is a positive real number, χ is a nonnegative real number, and δ is an integer, where the function(x) represents rounding the real number x up to, or down to, or to a nearest integer;

or $$S_i = \alpha \times (\beta \times \text{function}(\lambda \times nb \times Z/G) \times RV_i + \chi) + \delta; \quad \text{a third formula}$$

where, in the third formula, the nb is the total number of columns of the base graph matrix, Z is the lifting size, G is a real number greater than 0, α is a positive integer, β is a positive integer, the λ is a positive real number, χ is a nonnegative real number, and δ is an integer, where the function(x) represents rounding the real number x up to, or down to, or to a nearest integer.

In one embodiment, the starting position is determined according to the redundancy version, the lifting size, the total number of columns of the base graph matrix and the length of the information packet bit sequence.

In one embodiment, the starting position corresponding to the redundancy version being $RV_i$ is calculated via one of following formulas:

$$S_i = \alpha \times (\beta \times \text{function}((K + mb \times Z)/G) \times RV_i + \chi) + \delta; \text{ and}$$

$$S_i = \alpha \times (\beta \times \text{function}((K + mb \times Z)/G) + \chi) \times RV_i + \delta;$$

where in the above two formulas, K is the length of the information packet bit sequence, Z is the lifting size, G is a real number greater than 0, α is a positive integer, β is a positive integer, the λ is a positive real number, χ is a nonnegative real number, and δ is an integer, where the function(x) represents rounding the real number x up to, or down to, or to a nearest integer.

In one embodiment, the step in which the LDPC codeword sequence is interleaved to obtain the interleaved LDPC codeword sequence includes: interleaving all bits from the S0-th bit to the S1-th bit in the LDPC codeword sequence, where S0 and S1 are positive integers, and S1 is greater than the S0.

In one embodiment, the step in which all bits from the S0-th bit to the S1-th bit in the LDPC codeword sequence are interleaved includes: performing block interleaving on the all bits from the S0-th bit to the S1-th bit in the LDPC codeword sequence according to the interleaving matrix, where the number of columns of the block interleaving matrix is Z0, and Z0 is determined by a quasi-cyclic LDPC encoding parameter, where the quasi-cyclic LDPC encoding parameter includes at least one of: a lifting size, the total number of columns of a base graph matrix, the total number of rows of the base graph matrix, the number of system columns of the base graph matrix, or an information packet bit sequence length.

In one embodiment, Z0 is equal to a positive integer factor of the LDPC encoding lifting size.

In one embodiment, Z0 is equal to Z, Z is the LDPC encoding lifting size, S0 is equal to 2×Z, and S1 is equal to E×Z−1, where the E is an integer greater than 2.

In one embodiment, the E is equal to kb, kb+1, kb+2, kb+3 or kb+4, where the kb is the number of system columns of the base graph matrix of the LDPC encoding.

In one embodiment, Z0 is determined by following parameters: S0, S1 and a modulation order, where the modulation order is the number of bits carried by each modulation symbol.

In one embodiment, Z0 is calculated via the following formula: Z0=⌈(S1−S0+1)/M⌉, where the M is the modulation order and is a positive integer.

In one embodiment, the value of S1 is determined via at least one of following parameters: a length of an information packet bit sequence obtained after the code block partition is performed on the data to be sent, and a length of a bit sequence to be transmitted.

In one embodiment, when an LDPC encoding rate R is less than or equal to R0, the all bits from the S0-th bit to the S1-th bit in the LDPC codeword sequence are interleaved according to the interleaving matrix, where the R0 is a real number greater than or equal to ¾ and less than 1, and the LDPC encoding rate R is equal to a quotient of the length of an information packet bit sequence and the length of a bit sequence to be transmitted.

The present invention will be described below in detail in conjunction with preferred embodiments.

Preferred Embodiment One

The embodiment provides a quasi-cyclic LDPC encoding data processing method which can be applied to a new radio access technology (NR) communication system. The method provided in this optional embodiment can be applied to a Long Term Evolution (LTE) mobile communication system or a future 5G mobile communication system or other wireless or wired communication systems, and the data transmission direction is a direction where a base station sends data to a mobile user (downlink transmission of service data), or the data transmission direction is a direction where a mobile user sends data to a base station (uplink transmission of service data). The mobile user includes: a mobile device, an access terminal, a user terminal, a user station, a user unit, a mobile station, a remote station, a remote terminal, a user agent, a user equipment, a user device, or devices named after other terms. The base station includes: an access point (AP) which may be referred to as a node B, a radio network controller (RNC), an evolved node B (eNB), a base station controller (BSC), a base station controller (BTS), a base station (BS), a transceiver function (TF), a radio router, a radio transceiver, a basic service unit, an expansion service unit, a radio base station (RBS), or other devices named after other items.

According to one aspect of this optional embodiment, this optional embodiment provides a quasi-cyclic LDPC encoding data processing method which can be applied to an enhanced Mobile Broadband (eMBB) scenario, an Ultra-Reliable and Low Latency Communications (URLLC) scenario or a massive Machine Type Communications (mMTC) scenario in the new radio access technology (new RAT).

Figure 2:
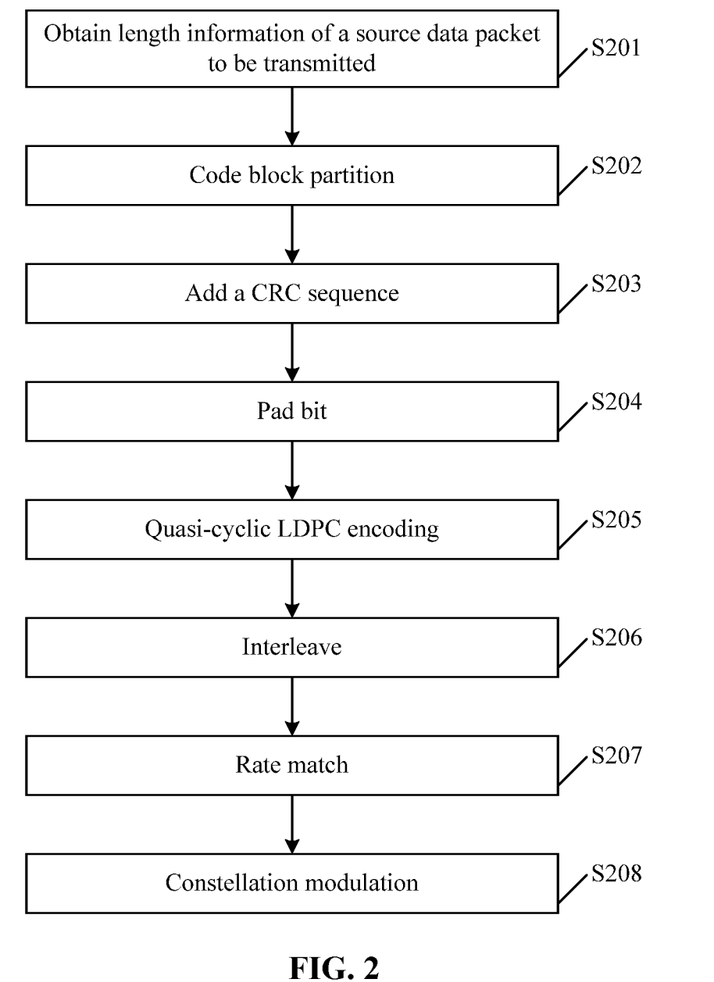
FIG. 2 is a flowchart of an LDPC encoding data processing method according to a preferred embodiment of the present invention.

FIG. 2 is a flowchart of an LDPC encoding data processing method according to a preferred embodiment of the present invention. As shown in FIG. 2, the method includes steps described below.

In step S201, length information of a source data packet to be transmitted is obtained, and a length of a source data packet to be transmitted which needs to be sent currently (also known as TBS) is determined from a TBS table according to control information, where the control information can be obtained from downlink or uplink control information or other system information.

In step S202, code block partition is performed. The source data packet to be transmitted is partitioned according to a length of a longest information block, $K_{max}$, where the number of information packet bit sequences obtained after the partition is $C = \lceil K/(K_{max}-L) \rceil$, and a length of the information packet bit sequence obtained after the code block partition includes $K_+ = \lceil K/C \rceil$ and $K_+ = \lceil K/C \rceil$, where the K is the length of the information packet bit sequence and is a positive integer, the $K_{max}$ is a positive integer, and the L is a length of a cyclic redundancy check (CRC) sequence added into each information packet bit sequence.

In step S203, a CRC sequence is added. A CRC sequence with the number L of bits is added into each information bit block obtained after the code block partition, where the L is an integer greater than 0.

In step S204, a bit is padded. A sub-bit is padded in the information bit block added with the CRC sequence, where the sub-bit is only used for assisting the encoding and does not participate in the transmission.

In step S205, the quasi-cyclic LDPC encoding is performed. A lifting size used by the LDPC encoding is determined according to the length of each information packet bit sequence obtained after the code block partition, a check matrix of the LDPC encoding is determined and calculated according to the obtained lifting size information, and the quasi-cyclic LDPC encoding is performed on each information packet bit sequence according to the check matrix and the LDPC encoding lifting size to obtain an LDPC codeword sequence.

The base graph matrix of the quasi-cyclic LDPC encoding includes two types of base graph matrixes: base graph 1 and base graph 2. The number of rows and columns of the base graph matrix, the base graph 1, are 46 and 68 respectively, that is, the total number of columns of the base graph matrix is 68, the total number of rows of the base graph matrix is 46, and the number of system columns of the base graph matrix is 68−46=22. The number of rows and columns of the base graph matrix, the base graph 2, are 42 and 52 respectively, that is, the total number of columns of the base graph matrix is 52, the total number of rows of the base graph matrix is 42, and the number of system columns of the base graph matrix is 52−42=10. According to the fact that the total number of columns of the base graph matrix is 68 or the total number of rows of the base graph matrix is 46 or the number of system columns of the base graph matrix is 22, it can be determined that an index corresponding to the base graph matrix is 1 (base graph 1). According to the fact that the total number of columns of the base graph matrix is 52 or the total number of rows of the base graph matrix is 42 or the number of system columns of the base graph matrix is 10, it can be determined that an index corresponding to the base graph matrix is 2 (base graph 2). For example, the table 1 shows a position of every element of value 1 with the row index (i) in the base graph 1 and the base graph 2, that is, the position can be replaced with a cyclic permutation identity matrix position. The table 2 shows lifting sizes supported by the base graph 1, including 8 lifting size sets. The table 4 shows lifting sizes supported by the base graph 2, also including 8 lifting size sets. A set index $i_{LS}$ of the lifting size set is determined according to the above lifting size information. A shift value matrix of each lifting size set corresponding to the base graph 1 is obtained from the table 3 according to the set index $i_{LS}$, a shift value matrix of each lifting size set corresponding to the base graph 2 is obtained from the table 5 according to the set index, and then the base graph matrix corresponding to the current lifting size $Z_c$ can be obtained according to the formula: $P_{i,j} = mod(V_{i,j}, Z_c)$. If the size of the information packet bit sequence is less than or equal to 2560 and the code rate is less than or equal to ⅔, the base graph 2 is selected, otherwise, the base graph 1 is selected. It is noted that in the table 1, the first column indicates row indices (i) of the base graph 1 and the base graph 2, the second column indicates column indices (j) of the base graph 1, and [i, j] determines the position of every element of value 1 of the base graph 1; besides, the third column indicates column indices (j) of the base graph 2. The table 3 and the table 4 respectively show 8 shift value matrixes corresponding to the base graph 1 and the base graph 2, where the i indicates the row index, the j indicates the column index, and the $i_{LS}$ indicates the set index of the lifting size set.

Table 1 Base graph 1 and base graph 2 are shown in Table 1 below.

| Row index (i) | Column indices (j) of every element of value 1 for base graph 1 | Column indices (j) of every element of value 1 for base graph 2 |
|---|---|---|
| 0 | 0, 1, 2, 3, 5, 6, 9, 10, 11, 12, 13, 15, 16, 18, 19, 20, 21, 22, 23 | 0, 1, 2, 3, 6, 9, 10, 11 |
| 1 | 0, 2, 3, 4, 5, 7, 8, 9, 11, 12, 14, 15, 16, 17, 19, 21, 22, 23, 24 | 0, 3, 4, 5, 6, 7, 8, 9, 11, 12 |
| 2 | 0, 1, 2, 4, 5, 6, 7, 8, 9, 10, 13, 14, 15, 17, 18, 19, 20, 24, 25 | 0, 1, 3, 4, 8, 10, 12, 13 |
| 3 | 0, 1, 3, 4, 6, 7, 8, 10, 11, 12, 13, 14, 16, 17, 18, 20, 21, 22, 25 | 1, 2, 4, 5, 6, 7, 8, 9, 10, 13 |
| 4 | 0, 1, 26 | 0, 1, 11, 14 |
| 5 | 0, 1, 3, 12, 16, 21, 22, 27 | 0, 1, 5, 7, 11, 15 |
| 6 | 0, 6, 10, 11, 13, 17, 18, 20, 28 | 0, 5, 7, 9, 11, 16 |
| 7 | 0, 1, 4, 7, 8, 14, 29 | 1, 5, 7, 11, 13, 17 |
| 8 | 0, 1, 3, 12, 16, 19, 21, 22, 24, 30 | 0, 1, 12, 18 |
| 9 | 0, 1, 10, 11, 13, 17, 18, 20, 31 | 1, 8, 10, 11, 19 |
| 10 | 1, 2, 4, 7, 8, 14, 32 | 0, 1, 6, 7, 20 |
| 11 | 0, 1, 12, 16, 21, 22, 23, 33 | 0, 7, 9, 13, 21 |
| 12 | 0, 1, 10, 11, 13, 18, 34 | 1, 3, 11, 22 |
| 13 | 0, 3, 7, 20, 23, 35 | 0, 1, 8, 13, 23 |
| 14 | 0, 12, 15, 16, 17, 21, 36 | 1, 6, 11, 13, 24 |
| 15 | 0, 1, 10, 13, 18, 25, 37 | 0, 10, 11, 25 |
| 16 | 1, 3, 11, 20, 22, 38 | 1, 9, 11, 12, 26 |
| 17 | 0, 14, 16, 17, 21, 39 | 1, 5, 11, 12, 27 |
| 18 | 1, 12, 13, 18, 19, 40 | 0, 6, 7, 28 |
| 19 | 0, 1, 7, 8, 10, 41 | 0, 1, 10, 29 |
| 20 | 0, 3, 9, 11, 22, 42 | 1, 4, 11, 30 |
| 21 | 1, 5, 16, 20, 21, 43 | 0, 8, 13, 31 |
| 22 | 0, 12, 13, 17, 44 | 1, 2, 32 |
| 23 | 1, 2, 10, 18, 45 | 0, 3, 5, 33 |
| 24 | 0, 3, 4, 11, 22, 46 | 1, 2, 9, 34 |
| 25 | 1, 6, 7, 14, 47 | 0, 5, 35 |
| 26 | 0, 2, 4, 15, 48 | 2, 7, 12, 13, 36 |
| 27 | 1, 6, 8, 49 | 0, 6, 37 |
| 28 | 0, 4, 19, 21, 50 | 1, 2, 5, 38 |
| 29 | 1, 14, 18, 25, 51 | 0, 4, 39 |
| 30 | 0, 10, 13, 24, 52 | 2, 5, 7, 9, 40 |
| 31 | 1, 7, 22, 25, 53 | 1, 13, 41 |
| 32 | 0, 12, 14, 24, 54 | 0, 5, 12, 42 |
| 33 | 1, 2, 11, 21, 55 | 2, 7, 10, 43 |
| 34 | 0, 7, 15, 17, 56 | 0, 12, 13, 44 |
| 35 | 1, 6, 12, 22, 57 | 1, 5, 11, 45 |
| 36 | 0, 14, 15, 18, 58 | 0, 2, 7, 46 |
| 37 | 1, 13, 23, 59 | 10, 13, 47 |
| 38 | 0, 9, 10, 12, 60 | 1, 5, 11, 48 |
| 39 | 1, 3, 7, 19, 61 | 0, 7, 12, 49 |
| 40 | 0, 8, 17, 62 | 2, 10, 13, 50 |
| 41 | 1, 3, 9, 18, 63 | 1, 5, 11, 51 |
| 42 | 0, 4, 24, 64 | |
| 43 | 1, 16, 18, 25, 65 | |
| 44 | 0, 7, 9, 22, 66 | |
| 45 | 1, 6, 10, 67 | |

Table 2 Lifting sizes of base graph 1 are shown in Table 2 below.

| Set index ($i_{LS}$) | Set of lifting sizes |
|---|---|
| 1 | {2, 4, 8, 16, 32, 64, 128, 256} |
| 2 | {3, 6, 12, 24, 48, 96, 192, 384} |
| 3 | {5, 10, 20, 40, 80, 160, 320} |
| 4 | {7, 14, 28, 56, 112, 224} |
| 5 | {9, 18, 36, 72, 144, 288} |
| 6 | {11, 22, 44, 88, 176, 352} |
| 7 | {13, 26, 52, 104, 208} |
| 8 | {15, 30, 60, 120, 240} |

Table 3 Shift values of base graph 1 are shown in Table 3 below.

| i | j | $i_{LS}$ 1 | 2 | 3 | 4 | 5 | 6 | 7 | 8 |
|---|---|---|---|---|---|---|---|---|---|
| 0 | 0 | 250 | 307 | 73 | 223 | 211 | 294 | 0 | 135 |
| | 1 | 69 | 19 | 15 | 16 | 198 | 118 | 0 | 227 |
| | 2 | 226 | 50 | 103 | 94 | 188 | 167 | 0 | 126 |
| | 3 | 159 | 369 | 49 | 91 | 186 | 330 | 0 | 134 |
| | 5 | 100 | 181 | 240 | 74 | 219 | 207 | 0 | 84 |
| | 6 | 10 | 216 | 39 | 10 | 4 | 165 | 0 | 83 |
| | 9 | 59 | 317 | 15 | 0 | 29 | 243 | 0 | 53 |
| | 10 | 229 | 288 | 162 | 205 | 144 | 250 | 0 | 225 |
| | 11 | 110 | 109 | 215 | 216 | 116 | 1 | 0 | 205 |
| | 12 | 191 | 17 | 164 | 21 | 216 | 339 | 0 | 128 |
| | 13 | 9 | 357 | 133 | 215 | 115 | 201 | 0 | 75 |
| | 15 | 195 | 215 | 298 | 14 | 233 | 53 | 0 | 135 |
| | 16 | 23 | 106 | 110 | 70 | 144 | 347 | 0 | 217 |
| | 18 | 190 | 242 | 113 | 141 | 95 | 304 | 0 | 220 |
| | 19 | 35 | 180 | 16 | 198 | 216 | 167 | 0 | 90 |
| | 20 | 239 | 330 | 189 | 104 | 73 | 47 | 0 | 105 |
| | 21 | 31 | 346 | 32 | 81 | 261 | 188 | 0 | 137 |
| | 22 | 1 | 1 | 1 | 1 | 1 | 1 | 0 | 1 |
| | 23 | 0 | 0 | 0 | 0 | 0 | 0 | 0 | 0 |
| 1 | 0 | 2 | 76 | 303 | 141 | 179 | 77 | 22 | 96 |
| | 2 | 239 | 76 | 294 | 45 | 162 | 225 | 11 | 236 |
| | 3 | 117 | 73 | 27 | 151 | 223 | 96 | 124 | 136 |
| | 4 | 124 | 288 | 261 | 46 | 256 | 338 | 0 | 221 |
| | 5 | 71 | 144 | 161 | 119 | 160 | 268 | 10 | 128 |
| | 7 | 222 | 331 | 133 | 157 | 76 | 112 | 0 | 92 |
| | 8 | 104 | 331 | 4 | 133 | 202 | 302 | 0 | 172 |
| | 9 | 173 | 178 | 80 | 87 | 117 | 50 | 2 | 56 |
| | 11 | 220 | 295 | 129 | 206 | 109 | 167 | 16 | 11 |
| | 12 | 102 | 342 | 300 | 93 | 15 | 253 | 60 | 189 |
| | 14 | 109 | 217 | 76 | 79 | 72 | 334 | 0 | 95 |
| | 15 | 132 | 99 | 266 | 9 | 152 | 242 | 6 | 85 |
| | 16 | 142 | 354 | 72 | 118 | 158 | 257 | 30 | 153 |
| | 17 | 155 | 114 | 83 | 194 | 147 | 133 | 0 | 87 |
| | 19 | 255 | 331 | 260 | 31 | 156 | 9 | 168 | 163 |
| | 21 | 28 | 112 | 301 | 187 | 119 | 302 | 31 | 216 |
| | 22 | 0 | 0 | 0 | 0 | 0 | 0 | 105 | 0 |
| | 23 | 0 | 0 | 0 | 0 | 0 | 0 | 0 | 0 |
| | 24 | 0 | 0 | 0 | 0 | 0 | 0 | 0 | 0 |
| 2 | 0 | 106 | 205 | 68 | 207 | 258 | 226 | 132 | 189 |
| | 1 | 111 | 250 | 7 | 203 | 167 | 35 | 37 | 4 |
| | 2 | 185 | 328 | 80 | 31 | 220 | 213 | 21 | 225 |
| | 4 | 63 | 332 | 280 | 176 | 133 | 302 | 180 | 151 |
| | 5 | 117 | 256 | 38 | 180 | 243 | 111 | 4 | 236 |
| | 6 | 93 | 161 | 227 | 186 | 202 | 265 | 149 | 117 |
| | 7 | 229 | 267 | 202 | 95 | 218 | 128 | 48 | 179 |
| | 8 | 177 | 160 | 200 | 153 | 63 | 237 | 38 | 92 |
| | 9 | 95 | 63 | 71 | 177 | 0 | 294 | 122 | 24 |
| | 10 | 39 | 129 | 106 | 70 | 3 | 127 | 195 | 68 |
| | 13 | 142 | 200 | 295 | 77 | 74 | 110 | 155 | 6 |
| | 14 | 225 | 88 | 283 | 214 | 229 | 286 | 28 | 101 |
| | 15 | 225 | 53 | 301 | 77 | 0 | 125 | 85 | 33 |
| | 17 | 245 | 131 | 184 | 198 | 216 | 131 | 47 | 96 |
| | 18 | 205 | 240 | 246 | 117 | 269 | 163 | 179 | 125 |
| | 19 | 251 | 205 | 230 | 223 | 200 | 210 | 42 | 67 |
| | 20 | 117 | 13 | 276 | 90 | 234 | 7 | 66 | 230 |
| | 24 | 0 | 0 | 0 | 0 | 0 | 0 | 0 | 0 |
| | 25 | 0 | 0 | 0 | 0 | 0 | 0 | 0 | 0 |
| 3 | 0 | 121 | 276 | 220 | 201 | 187 | 97 | 4 | 128 |
| | 1 | 89 | 87 | 208 | 18 | 145 | 94 | 6 | 23 |
| | 3 | 84 | 0 | 30 | 165 | 166 | 49 | 33 | 162 |
| | 4 | 20 | 275 | 197 | 5 | 108 | 279 | 113 | 220 |
| | 6 | 150 | 199 | 61 | 45 | 82 | 139 | 49 | 43 |
| | 7 | 131 | 153 | 175 | 142 | 132 | 166 | 21 | 186 |
| | 8 | 243 | 56 | 79 | 16 | 197 | 91 | 6 | 96 |
| | 10 | 136 | 132 | 281 | 34 | 41 | 106 | 151 | 1 |
| | 11 | 86 | 305 | 303 | 155 | 162 | 246 | 83 | 216 |
| | 12 | 246 | 231 | 253 | 213 | 57 | 345 | 154 | 22 |
| | 13 | 219 | 341 | 164 | 147 | 36 | 269 | 87 | 24 |
| | 14 | 211 | 212 | 53 | 69 | 115 | 185 | 5 | 167 |
| | 16 | 240 | 304 | 44 | 96 | 242 | 249 | 92 | 200 |
| | 17 | 76 | 300 | 28 | 74 | 165 | 215 | 173 | 32 |
| | 18 | 244 | 271 | 77 | 99 | 0 | 143 | 120 | 235 |
| | 20 | 144 | 39 | 319 | 30 | 113 | 121 | 2 | 172 |
| | 21 | 12 | 357 | 68 | 158 | 108 | 121 | 142 | 219 |
| | 22 | 1 | 1 | 1 | 1 | 1 | 1 | 0 | 1 |
| | 25 | 0 | 0 | 0 | 0 | 0 | 0 | 0 | 0 |

-continued

| i | j | 1 | 2 | 3 | 4 | 5 | 6 | 7 | 8 |
|---|---|---|---|---|---|---|---|---|---|
| 4 | 0 | 157 | 332 | 233 | 170 | 246 | 42 | 24 | 64 |
|  | 1 | 102 | 181 | 205 | 10 | 235 | 256 | 204 | 211 |
|  | 26 | 0 | 0 | 0 | 0 | 0 | 0 | 0 | 0 |
| 5 | 0 | 205 | 195 | 83 | 164 | 261 | 219 | 185 | 2 |
|  | 1 | 236 | 14 | 292 | 59 | 181 | 130 | 100 | 171 |
|  | 3 | 194 | 115 | 50 | 86 | 72 | 251 | 24 | 47 |
|  | 12 | 231 | 166 | 318 | 80 | 283 | 322 | 65 | 143 |
|  | 16 | 28 | 241 | 201 | 182 | 254 | 295 | 207 | 210 |
|  | 21 | 123 | 51 | 267 | 130 | 79 | 258 | 161 | 180 |
|  | 22 | 115 | 157 | 279 | 153 | 144 | 283 | 72 | 180 |
|  | 27 | 0 | 0 | 0 | 0 | 0 | 0 | 0 | 0 |
| 6 | 0 | 183 | 278 | 289 | 158 | 80 | 294 | 6 | 199 |
|  | 6 | 22 | 257 | 21 | 119 | 144 | 73 | 27 | 22 |
|  | 10 | 28 | 1 | 293 | 113 | 169 | 330 | 163 | 23 |
|  | 11 | 67 | 351 | 13 | 21 | 90 | 99 | 50 | 100 |
|  | 13 | 244 | 92 | 232 | 63 | 59 | 172 | 48 | 92 |
|  | 17 | 11 | 253 | 302 | 51 | 177 | 150 | 24 | 207 |
|  | 18 | 157 | 18 | 138 | 136 | 151 | 284 | 38 | 52 |
|  | 20 | 211 | 225 | 235 | 116 | 108 | 305 | 91 | 13 |
|  | 28 | 0 | 0 | 0 | 0 | 0 | 0 | 0 | 0 |
| 7 | 0 | 220 | 9 | 12 | 17 | 169 | 3 | 145 | 77 |
|  | 1 | 44 | 62 | 88 | 76 | 189 | 103 | 88 | 146 |
|  | 4 | 159 | 316 | 207 | 104 | 154 | 224 | 112 | 209 |
|  | 7 | 31 | 333 | 50 | 100 | 184 | 297 | 153 | 32 |
|  | 8 | 167 | 290 | 25 | 150 | 104 | 215 | 159 | 166 |
|  | 14 | 104 | 114 | 76 | 158 | 164 | 39 | 76 | 18 |
|  | 29 | 0 | 0 | 0 | 0 | 0 | 0 | 0 | 0 |
| 8 | 0 | 112 | 307 | 295 | 33 | 54 | 348 | 172 | 181 |
|  | 1 | 4 | 179 | 133 | 95 | 0 | 75 | 2 | 105 |
|  | 3 | 7 | 165 | 130 | 4 | 252 | 22 | 131 | 141 |
|  | 12 | 211 | 18 | 231 | 217 | 41 | 312 | 141 | 223 |
|  | 16 | 102 | 39 | 296 | 204 | 98 | 224 | 96 | 177 |
|  | 19 | 164 | 224 | 110 | 39 | 46 | 17 | 99 | 145 |
|  | 21 | 109 | 368 | 269 | 58 | 15 | 59 | 101 | 199 |
|  | 22 | 241 | 67 | 245 | 44 | 230 | 314 | 35 | 153 |
|  | 24 | 90 | 170 | 154 | 201 | 54 | 244 | 116 | 38 |
|  | 30 | 0 | 0 | 0 | 0 | 0 | 0 | 0 | 0 |
| 9 | 0 | 103 | 366 | 189 | 9 | 162 | 156 | 6 | 169 |
|  | 1 | 182 | 232 | 244 | 37 | 159 | 88 | 10 | 12 |
|  | 10 | 109 | 321 | 36 | 213 | 93 | 293 | 145 | 206 |
|  | 11 | 21 | 133 | 286 | 105 | 134 | 111 | 53 | 221 |
|  | 13 | 142 | 57 | 151 | 89 | 45 | 92 | 201 | 17 |
|  | 17 | 14 | 303 | 267 | 185 | 132 | 152 | 4 | 212 |
|  | 18 | 61 | 63 | 135 | 109 | 76 | 23 | 164 | 92 |
|  | 20 | 216 | 82 | 209 | 218 | 209 | 337 | 173 | 205 |
|  | 31 | 0 | 0 | 0 | 0 | 0 | 0 | 0 | 0 |
| 10 | 1 | 98 | 101 | 14 | 82 | 178 | 175 | 126 | 116 |
|  | 2 | 149 | 339 | 80 | 165 | 1 | 253 | 77 | 151 |
|  | 4 | 167 | 274 | 211 | 174 | 28 | 27 | 156 | 70 |
|  | 7 | 160 | 111 | 75 | 19 | 267 | 231 | 16 | 230 |
|  | 8 | 49 | 383 | 161 | 194 | 234 | 49 | 12 | 115 |
|  | 14 | 58 | 354 | 311 | 103 | 201 | 267 | 70 | 84 |
|  | 32 | 0 | 0 | 0 | 0 | 0 | 0 | 0 | 0 |
| 11 | 0 | 77 | 48 | 16 | 52 | 55 | 25 | 184 | 45 |
|  | 1 | 41 | 102 | 147 | 11 | 23 | 322 | 194 | 115 |
|  | 12 | 83 | 8 | 290 | 2 | 274 | 200 | 123 | 134 |
|  | 16 | 182 | 47 | 289 | 35 | 181 | 351 | 16 | 1 |
|  | 21 | 78 | 188 | 177 | 32 | 273 | 166 | 104 | 152 |
|  | 22 | 252 | 334 | 43 | 84 | 39 | 338 | 109 | 165 |
|  | 23 | 22 | 115 | 280 | 201 | 26 | 192 | 124 | 107 |
|  | 33 | 0 | 0 | 0 | 0 | 0 | 0 | 0 | 0 |
| 12 | 0 | 160 | 77 | 229 | 142 | 225 | 123 | 6 | 186 |
|  | 1 | 42 | 186 | 235 | 175 | 162 | 217 | 20 | 215 |
|  | 10 | 21 | 174 | 169 | 136 | 244 | 142 | 203 | 124 |
|  | 11 | 32 | 232 | 48 | 3 | 151 | 110 | 153 | 180 |
|  | 13 | 234 | 50 | 105 | 28 | 238 | 176 | 104 | 98 |
|  | 18 | 7 | 74 | 52 | 182 | 243 | 76 | 207 | 80 |
|  | 34 | 0 | 0 | 0 | 0 | 0 | 0 | 0 | 0 |
| 13 | 0 | 177 | 313 | 39 | 81 | 231 | 311 | 52 | 220 |
|  | 3 | 248 | 177 | 302 | 56 | 0 | 251 | 147 | 185 |
|  | 7 | 151 | 266 | 303 | 72 | 216 | 265 | 1 | 154 |
|  | 20 | 185 | 115 | 160 | 217 | 47 | 94 | 16 | 178 |
|  | 23 | 62 | 370 | 37 | 78 | 36 | 81 | 46 | 150 |
|  | 35 | 0 | 0 | 0 | 0 | 0 | 0 | 0 | 0 |

-continued

| i | j | 1 | 2 | 3 | 4 | 5 | 6 | 7 | 8 |
|---|---|---|---|---|---|---|---|---|---|
| 14 | 0 | 206 | 142 | 78 | 14 | 0 | 22 | 1 | 124 |
|  | 12 | 55 | 248 | 299 | 175 | 186 | 322 | 202 | 144 |
|  | 15 | 206 | 137 | 54 | 211 | 253 | 277 | 118 | 182 |
|  | 16 | 127 | 89 | 61 | 191 | 16 | 156 | 130 | 95 |
|  | 17 | 16 | 347 | 179 | 51 | 0 | 66 | 1 | 72 |
|  | 21 | 229 | 12 | 258 | 43 | 79 | 78 | 2 | 76 |
|  | 36 | 0 | 0 | 0 | 0 | 0 | 0 | 0 | 0 |
| 15 | 0 | 40 | 241 | 229 | 90 | 170 | 176 | 173 | 39 |
|  | 1 | 96 | 2 | 290 | 120 | 0 | 348 | 6 | 138 |
|  | 10 | 65 | 210 | 60 | 131 | 183 | 15 | 81 | 220 |
|  | 13 | 63 | 318 | 130 | 209 | 108 | 81 | 182 | 173 |
|  | 18 | 75 | 55 | 184 | 209 | 68 | 176 | 53 | 142 |
|  | 25 | 179 | 269 | 51 | 81 | 64 | 113 | 46 | 49 |
|  | 37 | 0 | 0 | 0 | 0 | 0 | 0 | 0 | 0 |
| 16 | 1 | 64 | 13 | 69 | 154 | 270 | 190 | 88 | 78 |
|  | 3 | 49 | 338 | 140 | 164 | 13 | 293 | 198 | 152 |
|  | 11 | 49 | 57 | 45 | 43 | 99 | 332 | 160 | 84 |
|  | 20 | 51 | 289 | 115 | 189 | 54 | 331 | 122 | 5 |
|  | 22 | 154 | 57 | 300 | 101 | 0 | 114 | 182 | 205 |
|  | 38 | 0 | 0 | 0 | 0 | 0 | 0 | 0 | 0 |
| 17 | 0 | 7 | 260 | 257 | 56 | 153 | 110 | 91 | 183 |
|  | 14 | 164 | 303 | 147 | 110 | 137 | 228 | 184 | 112 |
|  | 16 | 59 | 81 | 128 | 200 | 0 | 247 | 30 | 106 |
|  | 17 | 1 | 358 | 51 | 63 | 0 | 116 | 3 | 219 |
|  | 21 | 144 | 375 | 228 | 4 | 162 | 190 | 155 | 129 |
|  | 39 | 0 | 0 | 0 | 0 | 0 | 0 | 0 | 0 |
| 18 | 1 | 42 | 130 | 260 | 199 | 161 | 47 | 1 | 183 |
|  | 12 | 233 | 163 | 294 | 110 | 151 | 286 | 41 | 215 |
|  | 13 | 8 | 280 | 291 | 200 | 0 | 246 | 167 | 180 |
|  | 18 | 155 | 132 | 141 | 143 | 241 | 181 | 68 | 143 |
|  | 19 | 147 | 4 | 295 | 186 | 144 | 73 | 148 | 14 |
|  | 40 | 0 | 0 | 0 | 0 | 0 | 0 | 0 | 0 |
| 19 | 0 | 60 | 145 | 64 | 8 | 0 | 87 | 12 | 179 |
|  | 1 | 73 | 213 | 181 | 6 | 0 | 110 | 6 | 108 |
|  | 7 | 72 | 344 | 101 | 103 | 118 | 147 | 166 | 159 |
|  | 8 | 127 | 242 | 270 | 198 | 144 | 258 | 184 | 138 |
|  | 10 | 224 | 197 | 41 | 8 | 0 | 204 | 191 | 196 |
|  | 41 | 0 | 0 | 0 | 0 | 0 | 0 | 0 | 0 |
| 20 | 0 | 151 | 187 | 301 | 105 | 265 | 89 | 6 | 77 |
|  | 3 | 186 | 206 | 162 | 210 | 81 | 65 | 12 | 187 |
|  | 9 | 217 | 264 | 40 | 121 | 90 | 155 | 15 | 203 |
|  | 11 | 47 | 341 | 130 | 214 | 144 | 244 | 5 | 167 |
|  | 22 | 160 | 59 | 10 | 183 | 228 | 30 | 30 | 130 |
|  | 42 | 0 | 0 | 0 | 0 | 0 | 0 | 0 | 0 |
| 21 | 1 | 249 | 205 | 79 | 192 | 64 | 162 | 6 | 197 |
|  | 5 | 121 | 102 | 175 | 131 | 46 | 264 | 86 | 122 |
|  | 16 | 109 | 328 | 132 | 220 | 266 | 346 | 96 | 215 |
|  | 20 | 131 | 213 | 283 | 50 | 9 | 143 | 42 | 65 |
|  | 21 | 171 | 97 | 103 | 106 | 18 | 109 | 199 | 216 |
|  | 43 | 0 | 0 | 0 | 0 | 0 | 0 | 0 | 0 |
| 22 | 0 | 64 | 30 | 177 | 53 | 72 | 280 | 44 | 25 |
|  | 12 | 142 | 11 | 20 | 0 | 189 | 157 | 58 | 47 |
|  | 13 | 188 | 233 | 55 | 3 | 72 | 236 | 130 | 126 |
|  | 17 | 158 | 22 | 316 | 148 | 257 | 113 | 131 | 178 |
|  | 44 | 0 | 0 | 0 | 0 | 0 | 0 | 0 | 0 |
| 23 | 1 | 156 | 24 | 249 | 88 | 180 | 18 | 45 | 185 |
|  | 2 | 147 | 89 | 50 | 203 | 0 | 6 | 18 | 127 |
|  | 10 | 170 | 61 | 133 | 168 | 0 | 181 | 132 | 117 |
|  | 18 | 152 | 27 | 105 | 122 | 165 | 304 | 100 | 199 |
|  | 45 | 0 | 0 | 0 | 0 | 0 | 0 | 0 | 0 |
| 24 | 0 | 112 | 298 | 289 | 49 | 236 | 38 | 9 | 32 |
|  | 3 | 86 | 158 | 280 | 157 | 199 | 170 | 125 | 178 |
|  | 4 | 236 | 235 | 110 | 64 | 0 | 249 | 191 | 2 |
|  | 11 | 116 | 339 | 187 | 193 | 266 | 288 | 28 | 156 |
|  | 22 | 222 | 234 | 281 | 124 | 0 | 194 | 6 | 58 |
|  | 46 | 0 | 0 | 0 | 0 | 0 | 0 | 0 | 0 |
| 25 | 1 | 23 | 72 | 172 | 1 | 205 | 279 | 4 | 27 |
|  | 6 | 136 | 17 | 295 | 166 | 0 | 255 | 74 | 141 |
|  | 7 | 116 | 383 | 96 | 65 | 0 | 111 | 16 | 11 |
|  | 14 | 182 | 312 | 46 | 81 | 183 | 54 | 28 | 181 |
|  | 47 | 0 | 0 | 0 | 0 | 0 | 0 | 0 | 0 |

-continued

| i | j | \multicolumn{8}{c}{$i_{LS}$} |
|---|---|---|---|---|---|---|---|---|---|

| i | j | 1 | 2 | 3 | 4 | 5 | 6 | 7 | 8 |
|---|---|---|---|---|---|---|---|---|---|
| 26 | 0 | 195 | 71 | 270 | 107 | 0 | 325 | 21 | 163 |
|  | 2 | 243 | 81 | 110 | 176 | 0 | 326 | 142 | 131 |
|  | 4 | 215 | 76 | 318 | 212 | 0 | 226 | 192 | 169 |
|  | 15 | 61 | 136 | 67 | 127 | 277 | 99 | 197 | 98 |
|  | 48 | 0 | 0 | 0 | 0 | 0 | 0 | 0 | 0 |
| 27 | 1 | 25 | 194 | 210 | 208 | 45 | 91 | 98 | 165 |
|  | 6 | 104 | 194 | 29 | 141 | 36 | 326 | 140 | 232 |
|  | 8 | 194 | 101 | 304 | 174 | 72 | 268 | 22 | 9 |
|  | 49 | 0 | 0 | 0 | 0 | 0 | 0 | 0 | 0 |
| 28 | 0 | 128 | 222 | 11 | 146 | 275 | 102 | 4 | 32 |
|  | 4 | 165 | 19 | 293 | 153 | 0 | 1 | 1 | 43 |
|  | 19 | 181 | 244 | 50 | 217 | 155 | 40 | 40 | 200 |
|  | 21 | 63 | 274 | 234 | 114 | 62 | 167 | 93 | 205 |
|  | 50 | 0 | 0 | 0 | 0 | 0 | 0 | 0 | 0 |
| 29 | 1 | 86 | 252 | 27 | 150 | 0 | 273 | 92 | 232 |
|  | 14 | 236 | 5 | 308 | 11 | 180 | 104 | 136 | 32 |
|  | 18 | 84 | 147 | 117 | 53 | 0 | 243 | 106 | 118 |
|  | 25 | 6 | 78 | 29 | 68 | 42 | 107 | 6 | 103 |
|  | 51 | 0 | 0 | 0 | 0 | 0 | 0 | 0 | 0 |
| 30 | 0 | 216 | 159 | 91 | 34 | 0 | 171 | 2 | 170 |
|  | 10 | 73 | 229 | 23 | 130 | 90 | 16 | 88 | 199 |
|  | 13 | 120 | 260 | 105 | 210 | 252 | 95 | 112 | 26 |
|  | 24 | 9 | 90 | 135 | 123 | 173 | 212 | 20 | 105 |
|  | 52 | 0 | 0 | 0 | 0 | 0 | 0 | 0 | 0 |
| 31 | 1 | 95 | 100 | 222 | 175 | 144 | 101 | 4 | 73 |
|  | 7 | 177 | 215 | 308 | 49 | 144 | 297 | 49 | 149 |
|  | 22 | 172 | 258 | 66 | 177 | 166 | 279 | 125 | 175 |
|  | 25 | 61 | 256 | 162 | 128 | 19 | 222 | 194 | 108 |
|  | 53 | 0 | 0 | 0 | 0 | 0 | 0 | 0 | 0 |
| 32 | 0 | 221 | 102 | 210 | 192 | 0 | 351 | 6 | 103 |
|  | 12 | 112 | 201 | 22 | 209 | 211 | 265 | 126 | 110 |
|  | 14 | 199 | 175 | 271 | 58 | 36 | 338 | 63 | 151 |
|  | 24 | 121 | 287 | 217 | 30 | 162 | 83 | 20 | 211 |
|  | 54 | 0 | 0 | 0 | 0 | 0 | 0 | 0 | 0 |
| 33 | 1 | 2 | 323 | 170 | 114 | 0 | 56 | 10 | 199 |
|  | 2 | 187 | 8 | 20 | 49 | 0 | 304 | 30 | 132 |
|  | 11 | 41 | 361 | 140 | 161 | 76 | 141 | 6 | 172 |
|  | 21 | 211 | 105 | 33 | 137 | 18 | 101 | 92 | 65 |
|  | 55 | 0 | 0 | 0 | 0 | 0 | 0 | 0 | 0 |
| 34 | 0 | 127 | 230 | 187 | 82 | 197 | 60 | 4 | 161 |
|  | 7 | 167 | 148 | 296 | 186 | 0 | 320 | 153 | 237 |
|  | 15 | 164 | 202 | 5 | 68 | 108 | 112 | 197 | 142 |
|  | 17 | 159 | 312 | 44 | 150 | 0 | 54 | 155 | 180 |
|  | 56 | 0 | 0 | 0 | 0 | 0 | 0 | 0 | 0 |
| 35 | 1 | 161 | 320 | 207 | 192 | 199 | 100 | 4 | 231 |
|  | 6 | 197 | 335 | 158 | 173 | 278 | 210 | 45 | 174 |
|  | 12 | 207 | 2 | 55 | 26 | 0 | 195 | 168 | 145 |
|  | 22 | 103 | 266 | 285 | 187 | 205 | 268 | 185 | 100 |
|  | 57 | 0 | 0 | 0 | 0 | 0 | 0 | 0 | 0 |
| 36 | 0 | 37 | 210 | 259 | 222 | 216 | 135 | 6 | 11 |
|  | 14 | 105 | 313 | 179 | 157 | 16 | 15 | 200 | 207 |
|  | 15 | 51 | 297 | 178 | 0 | 0 | 35 | 177 | 42 |
|  | 18 | 120 | 21 | 160 | 6 | 0 | 188 | 43 | 100 |
|  | 58 | 0 | 0 | 0 | 0 | 0 | 0 | 0 | 0 |
| 37 | 1 | 198 | 269 | 298 | 81 | 72 | 319 | 82 | 59 |
|  | 13 | 220 | 82 | 15 | 195 | 144 | 236 | 2 | 204 |
|  | 23 | 122 | 115 | 115 | 138 | 0 | 85 | 135 | 161 |
|  | 59 | 0 | 0 | 0 | 0 | 0 | 0 | 0 | 0 |
| 38 | 0 | 167 | 185 | 151 | 123 | 190 | 164 | 91 | 121 |
|  | 9 | 151 | 177 | 179 | 90 | 0 | 196 | 64 | 90 |
|  | 10 | 157 | 289 | 64 | 73 | 0 | 209 | 198 | 26 |
|  | 12 | 163 | 214 | 181 | 10 | 0 | 246 | 100 | 140 |
|  | 60 | 0 | 0 | 0 | 0 | 0 | 0 | 0 | 0 |
| 39 | 1 | 173 | 258 | 102 | 12 | 153 | 236 | 4 | 115 |
|  | 3 | 139 | 93 | 77 | 77 | 0 | 264 | 28 | 188 |
|  | 7 | 149 | 346 | 192 | 49 | 165 | 37 | 109 | 168 |
|  | 19 | 0 | 297 | 208 | 114 | 117 | 272 | 188 | 52 |
|  | 61 | 0 | 0 | 0 | 0 | 0 | 0 | 0 | 0 |
| 40 | 0 | 157 | 175 | 32 | 67 | 216 | 304 | 10 | 4 |
|  | 8 | 137 | 37 | 80 | 45 | 144 | 237 | 84 | 103 |
|  | 17 | 149 | 312 | 197 | 96 | 2 | 135 | 12 | 30 |
|  | 62 | 0 | 0 | 0 | 0 | 0 | 0 | 0 | 0 |
| 41 | 1 | 167 | 52 | 154 | 23 | 0 | 123 | 2 | 53 |
|  | 3 | 173 | 314 | 47 | 215 | 0 | 77 | 75 | 189 |
|  | 9 | 139 | 139 | 124 | 60 | 0 | 25 | 142 | 215 |
|  | 18 | 151 | 288 | 207 | 167 | 183 | 272 | 128 | 24 |
|  | 63 | 0 | 0 | 0 | 0 | 0 | 0 | 0 | 0 |
| 42 | 0 | 149 | 113 | 226 | 114 | 27 | 288 | 163 | 222 |
|  | 4 | 157 | 14 | 65 | 91 | 0 | 83 | 10 | 170 |
|  | 24 | 137 | 218 | 126 | 78 | 35 | 17 | 162 | 71 |
|  | 64 | 0 | 0 | 0 | 0 | 0 | 0 | 0 | 0 |
| 43 | 1 | 151 | 113 | 228 | 206 | 52 | 210 | 1 | 22 |
|  | 16 | 163 | 132 | 69 | 22 | 243 | 3 | 163 | 127 |
|  | 18 | 173 | 114 | 176 | 134 | 0 | 53 | 99 | 49 |
|  | 25 | 139 | 168 | 102 | 161 | 270 | 167 | 98 | 125 |
|  | 65 | 0 | 0 | 0 | 0 | 0 | 0 | 0 | 0 |
| 44 | 0 | 139 | 80 | 234 | 84 | 18 | 79 | 4 | 191 |
|  | 7 | 157 | 78 | 227 | 4 | 0 | 244 | 6 | 211 |
|  | 9 | 163 | 163 | 259 | 9 | 0 | 293 | 142 | 187 |
|  | 22 | 173 | 274 | 260 | 12 | 57 | 272 | 3 | 148 |
|  | 66 | 0 | 0 | 0 | 0 | 0 | 0 | 0 | 0 |
| 45 | 1 | 149 | 135 | 101 | 184 | 168 | 82 | 181 | 177 |
|  | 6 | 151 | 149 | 228 | 121 | 0 | 67 | 45 | 114 |
|  | 10 | 167 | 15 | 126 | 29 | 144 | 235 | 153 | 93 |
|  | 67 | 0 | 0 | 0 | 0 | 0 | 0 | 0 | 0 |

Table 4 Lifting sizes of base graph 2 are shown in Table 4 below.

| Set index ($i_{LS}$) | Set of lifting sizes |
|---|---|
| 1 | {2, 4, 8, 16, 32, 64, 128, 256} |
| 2 | {3, 6, 12, 24, 48, 96, 192} |
| 3 | {5, 10, 20, 40, 80, 160} |
| 4 | {7, 14, 28, 56, 112, 224} |
| 5 | {9, 18, 36, 72, 144} |
| 6 | {11, 22, 44, 88, 176} |
| 7 | {13, 26, 52, 104, 208} |
| 8 | {15, 30, 60, 120, 240} |

Table 5 Shift values of base graph 2 are shown in Table 5 below.

| i | j | \multicolumn{8}{c}{$i_{LS}$} |
|---|---|---|---|---|---|---|---|---|---|

| i | j | 1 | 2 | 3 | 4 | 5 | 6 | 7 | 8 |
|---|---|---|---|---|---|---|---|---|---|
| 0 | 0 | 9 | 174 | 0 | 72 | 3 | 156 | 143 | 145 |
|  | 1 | 117 | 97 | 0 | 110 | 26 | 143 | 19 | 131 |
|  | 2 | 204 | 166 | 0 | 23 | 53 | 14 | 176 | 71 |
|  | 3 | 26 | 66 | 0 | 181 | 35 | 3 | 165 | 21 |
|  | 6 | 189 | 71 | 0 | 95 | 115 | 40 | 196 | 23 |
|  | 9 | 205 | 172 | 0 | 8 | 127 | 123 | 13 | 112 |
|  | 10 | 0 | 0 | 0 | 1 | 0 | 0 | 0 | 1 |
|  | 11 | 0 | 0 | 0 | 0 | 0 | 0 | 0 | 0 |
| 1 | 0 | 167 | 27 | 137 | 53 | 19 | 17 | 18 | 142 |
|  | 3 | 166 | 36 | 124 | 156 | 94 | 65 | 27 | 174 |
|  | 4 | 253 | 48 | 0 | 115 | 104 | 63 | 3 | 183 |
|  | 5 | 125 | 92 | 0 | 156 | 66 | 1 | 102 | 27 |
|  | 6 | 226 | 31 | 88 | 115 | 84 | 55 | 185 | 96 |
|  | 7 | 156 | 187 | 0 | 200 | 98 | 37 | 17 | 23 |
|  | 8 | 224 | 185 | 0 | 29 | 69 | 171 | 14 | 9 |
|  | 9 | 252 | 3 | 55 | 31 | 50 | 133 | 180 | 167 |
|  | 11 | 0 | 0 | 0 | 0 | 0 | 0 | 0 | 0 |
|  | 12 | 0 | 0 | 0 | 0 | 0 | 0 | 0 | 0 |
| 2 | 0 | 81 | 25 | 20 | 152 | 95 | 98 | 126 | 74 |
|  | 1 | 114 | 114 | 94 | 131 | 106 | 168 | 163 | 31 |
|  | 3 | 44 | 117 | 99 | 46 | 92 | 107 | 47 | 3 |
|  | 4 | 52 | 110 | 9 | 191 | 110 | 82 | 183 | 53 |

-continued

| i | j | \multicolumn{8}{c|}{$i_{LS}$} |
|---|---|---|---|---|---|---|---|---|---|
|   |   | 1 | 2 | 3 | 4 | 5 | 6 | 7 | 8 |
|   | 8 | 240 | 114 | 108 | 91 | 111 | 142 | 132 | 155 |
|   | 10 | 1 | 1 | 1 | 0 | 1 | 1 | 1 | 0 |
|   | 12 | 0 | 0 | 0 | 0 | 0 | 0 | 0 | 0 |
|   | 13 | 0 | 0 | 0 | 0 | 0 | 0 | 0 | 0 |
| 3 | 1 | 8 | 136 | 38 | 185 | 120 | 53 | 36 | 239 |
|   | 2 | 58 | 175 | 15 | 6 | 121 | 174 | 48 | 171 |
|   | 4 | 158 | 113 | 102 | 36 | 22 | 174 | 18 | 95 |
|   | 5 | 104 | 72 | 146 | 124 | 4 | 127 | 111 | 110 |
|   | 6 | 209 | 123 | 12 | 124 | 73 | 17 | 203 | 159 |
|   | 7 | 54 | 118 | 57 | 110 | 49 | 89 | 3 | 199 |
|   | 8 | 18 | 28 | 53 | 156 | 128 | 17 | 191 | 43 |
|   | 9 | 128 | 186 | 46 | 133 | 79 | 105 | 160 | 75 |
|   | 10 | 0 | 0 | 0 | 1 | 0 | 0 | 0 | 1 |
|   | 13 | 0 | 0 | 0 | 0 | 0 | 0 | 0 | 0 |
| 4 | 0 | 179 | 72 | 0 | 200 | 42 | 86 | 43 | 29 |
|   | 1 | 214 | 74 | 136 | 16 | 24 | 67 | 27 | 140 |
|   | 11 | 71 | 29 | 157 | 101 | 51 | 83 | 117 | 180 |
|   | 14 | 0 | 0 | 0 | 0 | 0 | 0 | 0 | 0 |
| 5 | 0 | 231 | 10 | 0 | 185 | 40 | 79 | 136 | 121 |
|   | 1 | 41 | 44 | 131 | 138 | 140 | 84 | 49 | 41 |
|   | 5 | 194 | 121 | 142 | 170 | 84 | 35 | 36 | 169 |
|   | 7 | 159 | 80 | 141 | 219 | 137 | 103 | 132 | 88 |
|   | 11 | 103 | 48 | 64 | 193 | 71 | 60 | 62 | 207 |
|   | 15 | 0 | 0 | 0 | 0 | 0 | 0 | 0 | 0 |
| 6 | 0 | 155 | 129 | 0 | 123 | 109 | 47 | 7 | 137 |
|   | 5 | 228 | 92 | 124 | 55 | 87 | 154 | 34 | 72 |
|   | 7 | 45 | 100 | 99 | 31 | 107 | 10 | 198 | 172 |
|   | 9 | 28 | 49 | 45 | 222 | 133 | 155 | 168 | 124 |
|   | 11 | 158 | 184 | 148 | 209 | 139 | 29 | 12 | 56 |
|   | 16 | 0 | 0 | 0 | 0 | 0 | 0 | 0 | 0 |
| 7 | 1 | 129 | 80 | 0 | 103 | 97 | 48 | 163 | 86 |
|   | 5 | 147 | 186 | 45 | 13 | 135 | 125 | 78 | 186 |
|   | 7 | 140 | 16 | 148 | 105 | 35 | 24 | 143 | 87 |
|   | 11 | 3 | 102 | 96 | 150 | 108 | 47 | 107 | 172 |
|   | 13 | 116 | 143 | 78 | 181 | 65 | 55 | 58 | 154 |
|   | 17 | 0 | 0 | 0 | 0 | 0 | 0 | 0 | 0 |
| 8 | 0 | 142 | 118 | 0 | 147 | 70 | 53 | 101 | 176 |
|   | 1 | 94 | 70 | 65 | 43 | 69 | 31 | 177 | 169 |
|   | 12 | 230 | 152 | 87 | 152 | 88 | 161 | 22 | 225 |
|   | 18 | 0 | 0 | 0 | 0 | 0 | 0 | 0 | 0 |
| 9 | 1 | 203 | 28 | 0 | 2 | 97 | 104 | 186 | 167 |
|   | 8 | 205 | 132 | 97 | 30 | 40 | 142 | 27 | 238 |
|   | 10 | 61 | 185 | 51 | 184 | 24 | 99 | 205 | 48 |
|   | 11 | 247 | 178 | 85 | 83 | 49 | 64 | 81 | 68 |
|   | 19 | 0 | 0 | 0 | 0 | 0 | 0 | 0 | 0 |
| 10 | 0 | 11 | 59 | 0 | 174 | 46 | 111 | 125 | 38 |
|   | 1 | 185 | 104 | 17 | 150 | 41 | 25 | 60 | 217 |
|   | 6 | 0 | 22 | 156 | 8 | 101 | 174 | 177 | 208 |
|   | 7 | 117 | 52 | 20 | 56 | 96 | 23 | 51 | 232 |
|   | 20 | 0 | 0 | 0 | 0 | 0 | 0 | 0 | 0 |
| 11 | 0 | 11 | 32 | 0 | 99 | 28 | 91 | 39 | 178 |
|   | 7 | 236 | 92 | 7 | 138 | 30 | 175 | 29 | 214 |
|   | 9 | 210 | 174 | 4 | 110 | 116 | 24 | 35 | 168 |
|   | 13 | 56 | 154 | 2 | 99 | 64 | 141 | 8 | 51 |
|   | 21 | 0 | 0 | 0 | 0 | 0 | 0 | 0 | 0 |
| 12 | 1 | 63 | 39 | 0 | 46 | 33 | 122 | 18 | 124 |
|   | 3 | 111 | 93 | 113 | 217 | 122 | 11 | 155 | 122 |
|   | 11 | 14 | 11 | 48 | 109 | 131 | 4 | 49 | 72 |
|   | 22 | 0 | 0 | 0 | 0 | 0 | 0 | 0 | 0 |
| 13 | 0 | 83 | 49 | 0 | 37 | 76 | 29 | 32 | 48 |
|   | 1 | 2 | 125 | 112 | 113 | 37 | 91 | 53 | 57 |
|   | 8 | 38 | 35 | 102 | 143 | 62 | 27 | 95 | 167 |
|   | 13 | 222 | 166 | 26 | 140 | 47 | 127 | 186 | 219 |
|   | 23 | 0 | 0 | 0 | 0 | 0 | 0 | 0 | 0 |
| 14 | 1 | 115 | 19 | 0 | 36 | 143 | 11 | 91 | 82 |
|   | 6 | 145 | 118 | 138 | 95 | 51 | 145 | 20 | 232 |
|   | 11 | 3 | 21 | 57 | 40 | 130 | 8 | 52 | 204 |
|   | 13 | 232 | 163 | 27 | 116 | 97 | 166 | 109 | 162 |
|   | 24 | 0 | 0 | 0 | 0 | 0 | 0 | 0 | 0 |
| 15 | 0 | 51 | 68 | 0 | 116 | 139 | 137 | 174 | 38 |
|   | 10 | 175 | 63 | 73 | 200 | 96 | 103 | 108 | 217 |
|   | 11 | 213 | 81 | 99 | 110 | 128 | 40 | 102 | 157 |
|   | 25 | 0 | 0 | 0 | 0 | 0 | 0 | 0 | 0 |
| 16 | 1 | 203 | 87 | 0 | 75 | 48 | 78 | 125 | 170 |
|   | 9 | 142 | 177 | 79 | 158 | 9 | 158 | 31 | 23 |

-continued

| i | j | \multicolumn{8}{c|}{$i_{LS}$} |
|---|---|---|---|---|---|---|---|---|---|
|   |   | 1 | 2 | 3 | 4 | 5 | 6 | 7 | 8 |
|   | 11 | 8 | 135 | 111 | 134 | 28 | 17 | 54 | 175 |
|   | 12 | 242 | 64 | 143 | 97 | 8 | 165 | 176 | 202 |
|   | 26 | 0 | 0 | 0 | 0 | 0 | 0 | 0 | 0 |
| 17 | 1 | 254 | 158 | 0 | 48 | 120 | 134 | 57 | 196 |
|   | 5 | 124 | 23 | 24 | 132 | 43 | 23 | 201 | 173 |
|   | 11 | 114 | 9 | 109 | 206 | 65 | 62 | 142 | 195 |
|   | 12 | 64 | 6 | 18 | 2 | 42 | 163 | 35 | 218 |
|   | 27 | 0 | 0 | 0 | 0 | 0 | 0 | 0 | 0 |
| 18 | 0 | 220 | 186 | 0 | 68 | 17 | 173 | 129 | 128 |
|   | 6 | 194 | 6 | 18 | 16 | 106 | 31 | 203 | 211 |
|   | 7 | 50 | 46 | 86 | 156 | 142 | 22 | 140 | 210 |
|   | 28 | 0 | 0 | 0 | 0 | 0 | 0 | 0 | 0 |
| 19 | 0 | 87 | 58 | 0 | 35 | 79 | 13 | 110 | 39 |
|   | 1 | 20 | 42 | 158 | 138 | 28 | 135 | 124 | 84 |
|   | 10 | 185 | 156 | 154 | 86 | 41 | 145 | 52 | 88 |
|   | 29 | 0 | 0 | 0 | 0 | 0 | 0 | 0 | 0 |
| 20 | 1 | 26 | 76 | 0 | 6 | 2 | 128 | 196 | 117 |
|   | 4 | 105 | 61 | 148 | 20 | 103 | 52 | 35 | 227 |
|   | 11 | 29 | 153 | 104 | 141 | 78 | 173 | 114 | 6 |
|   | 30 | 0 | 0 | 0 | 0 | 0 | 0 | 0 | 0 |
| 21 | 0 | 76 | 157 | 0 | 80 | 91 | 156 | 10 | 238 |
|   | 8 | 42 | 175 | 17 | 43 | 75 | 166 | 122 | 13 |
|   | 13 | 210 | 67 | 33 | 81 | 81 | 40 | 23 | 11 |
|   | 31 | 0 | 0 | 0 | 0 | 0 | 0 | 0 | 0 |
| 22 | 1 | 222 | 20 | 0 | 49 | 54 | 18 | 202 | 195 |
|   | 2 | 63 | 52 | 4 | 1 | 132 | 163 | 126 | 44 |
|   | 32 | 0 | 0 | 0 | 0 | 0 | 0 | 0 | 0 |
| 23 | 0 | 23 | 106 | 0 | 156 | 68 | 110 | 52 | 5 |
|   | 3 | 235 | 86 | 75 | 54 | 115 | 132 | 170 | 94 |
|   | 5 | 238 | 95 | 158 | 134 | 56 | 150 | 13 | 111 |
|   | 33 | 0 | 0 | 0 | 0 | 0 | 0 | 0 | 0 |
| 24 | 1 | 46 | 182 | 0 | 153 | 30 | 113 | 113 | 81 |
|   | 2 | 139 | 153 | 69 | 88 | 42 | 108 | 161 | 19 |
|   | 9 | 8 | 64 | 87 | 63 | 101 | 61 | 88 | 130 |
|   | 34 | 0 | 0 | 0 | 0 | 0 | 0 | 0 | 0 |
| 25 | 0 | 228 | 45 | 0 | 211 | 128 | 72 | 197 | 66 |
|   | 5 | 156 | 21 | 65 | 94 | 63 | 136 | 194 | 95 |
|   | 35 | 0 | 0 | 0 | 0 | 0 | 0 | 0 | 0 |
| 26 | 2 | 29 | 67 | 0 | 90 | 142 | 36 | 164 | 146 |
|   | 7 | 143 | 137 | 100 | 6 | 28 | 38 | 172 | 66 |
|   | 12 | 160 | 55 | 13 | 221 | 100 | 53 | 49 | 190 |
|   | 13 | 122 | 85 | 7 | 6 | 133 | 145 | 161 | 86 |
|   | 36 | 0 | 0 | 0 | 0 | 0 | 0 | 0 | 0 |
| 27 | 0 | 8 | 103 | 0 | 27 | 13 | 42 | 168 | 64 |
|   | 6 | 151 | 50 | 32 | 118 | 10 | 104 | 193 | 181 |
|   | 37 | 0 | 0 | 0 | 0 | 0 | 0 | 0 | 0 |
| 28 | 1 | 98 | 70 | 0 | 216 | 106 | 64 | 14 | 7 |
|   | 2 | 101 | 111 | 126 | 212 | 77 | 24 | 186 | 144 |
|   | 5 | 135 | 168 | 110 | 193 | 43 | 149 | 46 | 16 |
|   | 38 | 0 | 0 | 0 | 0 | 0 | 0 | 0 | 0 |
| 29 | 0 | 18 | 110 | 0 | 108 | 133 | 139 | 50 | 25 |
|   | 4 | 28 | 17 | 154 | 61 | 25 | 161 | 27 | 57 |
|   | 39 | 0 | 0 | 0 | 0 | 0 | 0 | 0 | 0 |
| 30 | 2 | 71 | 120 | 0 | 106 | 87 | 84 | 70 | 37 |
|   | 5 | 240 | 154 | 35 | 44 | 56 | 173 | 17 | 139 |
|   | 7 | 9 | 52 | 51 | 185 | 104 | 93 | 50 | 221 |
|   | 9 | 84 | 56 | 134 | 176 | 70 | 29 | 6 | 17 |
|   | 40 | 0 | 0 | 0 | 0 | 0 | 0 | 0 | 0 |
| 31 | 1 | 106 | 3 | 0 | 147 | 80 | 117 | 115 | 201 |
|   | 13 | 1 | 170 | 20 | 182 | 139 | 148 | 189 | 46 |
|   | 41 | 0 | 0 | 0 | 0 | 0 | 0 | 0 | 0 |
| 32 | 0 | 242 | 84 | 0 | 108 | 32 | 116 | 110 | 179 |
|   | 5 | 44 | 8 | 20 | 21 | 89 | 73 | 0 | 14 |
|   | 12 | 166 | 17 | 122 | 110 | 71 | 142 | 163 | 116 |
|   | 42 | 0 | 0 | 0 | 0 | 0 | 0 | 0 | 0 |
| 33 | 2 | 132 | 165 | 0 | 71 | 135 | 105 | 163 | 46 |
|   | 7 | 164 | 179 | 88 | 12 | 6 | 137 | 173 | 2 |
|   | 10 | 235 | 124 | 13 | 109 | 2 | 29 | 179 | 106 |
|   | 43 | 0 | 0 | 0 | 0 | 0 | 0 | 0 | 0 |
| 34 | 0 | 147 | 173 | 0 | 29 | 37 | 11 | 197 | 184 |
|   | 12 | 85 | 177 | 19 | 201 | 25 | 41 | 191 | 135 |
|   | 13 | 36 | 12 | 78 | 69 | 114 | 162 | 193 | 141 |
|   | 44 | 0 | 0 | 0 | 0 | 0 | 0 | 0 | 0 |

-continued

| i | j | 1 | 2 | 3 | 4 | 5 | 6 | 7 | 8 |
|---|---|---|---|---|---|---|---|---|---|
| 35 | 1 | 57 | 77 | 0 | 91 | 60 | 126 | 157 | 85 |
|  | 5 | 40 | 184 | 157 | 165 | 137 | 152 | 167 | 225 |
|  | 11 | 63 | 18 | 6 | 55 | 93 | 172 | 181 | 175 |
|  | 45 | 0 | 0 | 0 | 0 | 0 | 0 | 0 | 0 |
| 36 | 0 | 140 | 25 | 0 | 1 | 121 | 73 | 197 | 178 |
|  | 2 | 38 | 151 | 63 | 175 | 129 | 154 | 167 | 112 |
|  | 7 | 154 | 170 | 82 | 83 | 26 | 129 | 179 | 106 |
|  | 46 | 0 | 0 | 0 | 0 | 0 | 0 | 0 | 0 |
| 37 | 10 | 219 | 37 | 0 | 40 | 97 | 167 | 181 | 154 |
|  | 13 | 151 | 31 | 144 | 12 | 56 | 38 | 193 | 114 |
|  | 47 | 0 | 0 | 0 | 0 | 0 | 0 | 0 | 0 |
| 38 | 1 | 31 | 84 | 0 | 37 | 1 | 112 | 157 | 42 |
|  | 5 | 66 | 151 | 93 | 97 | 70 | 7 | 173 | 41 |
|  | 11 | 38 | 190 | 19 | 46 | 1 | 19 | 191 | 105 |
|  | 48 | 0 | 0 | 0 | 0 | 0 | 0 | 0 | 0 |
| 39 | 0 | 239 | 93 | 0 | 106 | 119 | 109 | 181 | 167 |
|  | 7 | 172 | 132 | 24 | 181 | 32 | 6 | 157 | 45 |
|  | 12 | 34 | 57 | 138 | 154 | 142 | 105 | 173 | 189 |
|  | 49 | 0 | 0 | 0 | 0 | 0 | 0 | 0 | 0 |
| 40 | 2 | 0 | 103 | 0 | 98 | 6 | 160 | 193 | 78 |
|  | 10 | 75 | 107 | 36 | 35 | 73 | 156 | 163 | 67 |
|  | 13 | 120 | 163 | 143 | 36 | 102 | 82 | 179 | 180 |
|  | 50 | 0 | 0 | 0 | 0 | 0 | 0 | 0 | 0 |
| 41 | 1 | 129 | 147 | 0 | 120 | 48 | 132 | 191 | 53 |
|  | 5 | 229 | 7 | 2 | 101 | 47 | 6 | 197 | 215 |
|  | 11 | 118 | 60 | 55 | 81 | 19 | 8 | 167 | 230 |
|  | 51 | 0 | 0 | 0 | 0 | 0 | 0 | 0 | 0 |

In step S206, interleaving is performed. The interleaving is to interleave the LDPC codeword sequence to obtain an interleaved LDPC codeword sequence. The interleaving method includes: performing block interleaving on the LDPC codeword sequence, where the number of rows of the interleaving matrix is determined according to the quasi-cyclic LDPC encoding parameter, and the quasi-cyclic LDPC encoding parameter includes at least one of: a lifting size, the total number of columns of a base graph matrix, the total number of rows of the base graph matrix, or the number of system columns of the base graph matrix.

In one specific embodiment, the number of rows of the interleaving matrix is equal to a positive integer factor of the quasi-cyclic LDPC lifting size, or is equal to a positive integer multiple of a lifting size of the quasi-cyclic LDPC encoding.

In one specific embodiment, the number of rows of the interleaving matrix is equal to a positive integer factor of the total number of columns of the base graph matrix of the quasi-cyclic LDPC encoding, or is equal to a positive integer multiple of the total number of columns of the base graph matrix of the quasi-cyclic LDPC encoding.

In one specific embodiment, the interleaving matrix is interleaved in a manner in which data in the matrix is inputted along the column and outputted along the column.

In one specific embodiment, in the interleaving method, outputting is performed according to a predetermined column order to obtain the interleaved codeword sequence.

In one specific embodiment, in the interleaving method, intra-column interleaving is performed on the columns in the interleaving matrix, where the intra-column interleaving method includes: cyclic shift interleaving and random sequence interleaving. Preferably, the intra-column interleaving method is determined according to a modulation order. Preferably, in condition that the modulation order is greater than 2, the intra-column interleaving method is executed.

The interleaving method includes: mapping all bits from the S0-th bit to the S1-th bit in the LDPC codeword sequence onto bits from the S0-th bit to the S1-th bit of the interleaved codeword sequence according to a predetermined interleaving index sequence, where S0 is a positive integer, and S1 is an integer greater than the S0.

The predetermined interleaving index sequence is obtained in a block interleaving manner, the number of columns of the block interleaving matrix is Z0, and Z0 is a positive integer.

In one more specific embodiment, Z0 is equal to a positive integer factor of the LDPC encoding lifting size.

In one more specific embodiment, Z0 is equal to Z, Z is the LDPC encoding lifting size, S0 is equal to 2×Z, and S1 is equal to E×Z−1, where the E is an integer greater than 2. Furthermore, the E is equal to kb, kb+1, kb+2, kb+3 or kb+4, where the kb is the number of system columns of the base graph matrix of the LDPC encoding.

Preferably, in one more specific embodiment, S0 is equal to kb×Z, and S1 is equal to E×Z−1, where Z is the LDPC encoding lifting size, the E is equal to kb+Δmb, the Δmb is an integer greater than 0, and the kb is the number of system columns of the base graph matrix of the LDPC encoding. Furthermore, the Δmb is determined according one of following combinations of parameters: combination 1, composed of the number of system columns of the base graph matrix of the LDPC encoding and an encoding rate; combination 2, composed of the length of the information packet bit sequence, the length of the bit sequence to be transmitted, and the LDPC encoding lifting size; and combination 3, composed of the number of LDPC code check bits contained in the bit sequence to be transmitted and the LDPC encoding lifting size.

In one more specific embodiment, Z0 is determined by following parameters: S0, S1 and a modulation order, where the modulation order is the number of bits carried by each modulation symbol. Preferably, Z0 is calculated via the following formula:

$$Z0 = \left\lceil \frac{(S1 - S0 + 1)}{M} \right\rceil,$$

where the M is the modulation order and is a positive integer.

In one more specific embodiment, the specific value of S1 is determined by following parameters: the length of the information packet bit sequence, and the length of the bit sequence to be transmitted.

In one more specific embodiment, when the code rate R is less than or equal to R0, the block interleaving is performed, where the R0 is a real number greater than or equal to ¾ and less than 1, and the code rate R is equal to a value obtained after the length of the information packet bit sequence is divided by the length of the bit sequence to be transmitted.

The above interleaving method has following benefic effects: the LDPC codeword can be effectively randomized, the LDPC code can obtain better performance advantages in the high-order modulation (e.g., 64 quadrature amplitude modulation (QAM) and 256 QAM), and the performance of the LDPC code in the fading channel can be effectively improved.

In step S207, rate matching is performed. Cyclic bit selection is performed on the interleaved LDPC codeword sequence from a starting position to obtain a rate-matched codeword sequence. The starting position is determined according to a predetermined parameter, where the predetermined parameter includes at least one of: a redundancy version, a lifting size, the total number of columns of the base graph matrix, the total number of rows of the base graph matrix, the number of system columns of the base graph matrix or a length of the information packet bit sequence.

In one more specific embodiment, the starting position is determined according to the redundancy version, the lifting size and the total number of columns of the base graph matrix. Furthermore, the starting position corresponding to the redundancy version being RVi is calculated via the following formula:

$$S_i = \alpha \times \text{function}(\beta \times (nb/G) \times RV_i + \chi) \times Z + \delta,$$

where, in the formula, the nb is the total number of columns of the base graph matrix, Z is the lifting size, $\alpha$ is a positive integer, G is a real number greater than 0, $\beta$ is a positive real number, $\chi$ is a nonnegative real number, and $\delta$ is an integer, where the function(x) represents rounding the real number x up to, or down to, or to a nearest integer.

Furthermore, the starting position corresponding to the redundancy version being $RV_i$ is calculated via the following formula: $S_i = \alpha \times (\beta \times \text{function}(\lambda \times nb/G) \times RV_i + \chi) \times Z + \delta$.

Where in the formula, the nb is the total number of columns of the base graph matrix, Z is the lifting size, $\alpha$ is a positive integer, G is a real number greater than 0, $\beta$ is a positive integer, the $\lambda$ is a positive real number, $\chi$ is a nonnegative real number, and $\delta$ is an integer, where the function(x) represents rounding the real number x up to, or down to, or to a nearest integer.

Furthermore, the starting position corresponding to the redundancy version being $RV_i$ is calculated via the following formula: $S_i = \alpha \times (\beta \times \text{function}(\lambda \times nb \times Z/G) \times RV_i + \chi) + \delta$.

Where in the formula, nb is the total number of columns of the base graph matrix, Z is the lifting size, G is a real number greater than 0, $\alpha$ is a positive integer, $\beta$ is a positive integer, $\lambda$ is a positive real number, $\chi$ is a nonnegative real number, and $\delta$ is an integer. Where the function(x) represents rounding the real number x up to, or down to, or to a nearest integer.

In one more specific embodiment, the starting position is determined according to the redundancy version, the lifting size, the total number of rows of the base graph matrix, and the length of the information packet bit sequence. Furthermore, the starting position corresponding to the redundancy version being $RV_i$ is calculated via one of following formulas: $S_i = \alpha \times (\beta \times \text{function}((K+mb \times Z)/G) \times RV_i + \chi) + \delta$; and $S_i = \alpha \times (\beta \times \text{function}((K+mb \times Z)/G) + \chi) \times RV_i + \delta$, Where in the above formulas, K is the length of the information packet bit sequence, Z is the lifting size, G is a real number greater than 0, $\alpha$ is a positive integer, $\beta$ is a positive integer, $\lambda$ is a positive real number, $\chi$ is a nonnegative real number, and $\delta$ is an integer, where the function(x) represents rounding the real number x up to, or down to, or to a nearest integer.

The cyclic bit selection is performed on the interleaved codeword sequence. Bits from the 2×Z-th bit to the tail bit in the interleaved codeword sequence are stored in one circular buffer, and N bits are obtained sequentially from the circular buffer according to the redundancy version to form the bit sequence to be transmitted.

In step S208, constellation modulation is performed. The bit sequence to be transmitted is divided into a plurality of bit packets, the plurality of bit packets is mapped onto a constellation modulation symbol, and the constellation modulation symbol is sent. In a preferred embodiment, before the plurality of bit packets is mapped onto the constellation modulation symbol, bits in the bit packet are interleaved respectively, and the each interleaved bit packet is mapped onto the constellation modulation symbol. The modulation order of the constellation modulation symbol is M, and the modulation order represents the number of bits carried by each constellation modulation symbol. The constellation symbol modulation includes one of the following: binary phase shift keying (BPSK), quadrature phase shift keying (QPSK), 16 QAM, 64 QAM or 256 QAM, and the corresponding modulation orders are 1, 2, 4, 6, and 8 respectively. Preferably, in one specific embodiment, the intra-bit packet interleaving is determined according to the modulation order. For example, in condition that the modulation order is greater than M1, the interleaving method is executed, where the M1 is equal to 2, 3, 4, 5 or 6. Preferably, the intra-bit packet interleaving includes: cyclic shift interleaving and random index sequence interleaving. Preferably, the interleaving methods of any adjacent F constellation symbols in all constellation modulation symbols are different, where the F is a positive integer. In another embodiment, G0 intra-bit packet interleaving methods exist, and the G0 methods are different. The intra-bit packet bit interleaving selects G1 methods from the G0 methods to interleave bits in each bit packet according to a certain order sequentially. In another embodiment, a plurality of intra-bit packet interleaving method sets exists, and the intra-bit packet interleaving method is determined from the plurality of interleaving method sets according to the modulation order.

From the description of the above-mentioned embodiments, it will be apparent to those skilled in the art that the method in the embodiments described above may be implemented by software plus a necessary general-purpose hardware platform, or may of course be implemented by hardware. However, in many cases, the former is a preferred implementation manner. Based on this understanding, the solutions provided by the present invention substantially, or the part contributing to the related art, may be embodied in the form of a software product. The computer software product is stored in a storage medium (such as a read only memory (ROM)/random access memory (RAM), a magnetic disk or an optical disk) and includes several instructions for enabling a terminal device (which may be a mobile phone, a computer, a server, a network device or the like) to execute the method according to each embodiment of the present disclosure.

Embodiment Two

The embodiment further provides a data encoding device. The device is used for implementing the above-mentioned embodiments and preferred implementations, and what has been described will not be repeated. As used below, the term "module" may be software, hardware or a combination thereof capable of implementing predetermined functions. The device in the embodiment described below is preferably implemented by software, but implementation by hardware or by a combination of software and hardware is also possible and conceived.

According to another embodiment of the present invention, a data encoding device is further provided. The device includes an obtaining module, an interleaving module, a selecting module and a sending module.

The obtaining module is configured to obtain data to be sent.

The interleaving module is connected to the obtaining module and configured to perform quasi-cyclic LDPC encoding on the data to be sent to obtain an LDPC codeword sequence, and interleave the LDPC codeword sequence to obtain an interleaved LDPC codeword sequence.

The selecting module is connected to the interleaving module and configured to perform cyclic bit selection on the interleaved LDPC codeword sequence from a starting position to obtain a rate-matched codeword sequence, where the starting position is determined according to a predetermined parameter, where the predetermined parameter includes at least one of: a redundancy version, a lifting size, the total number of columns of a base graph matrix, the total number of rows of the base graph matrix, the number of system columns of the base graph matrix or a length of an information packet bit sequence.

The sending module is connected to the selecting module and configured to send the rate-matched codeword sequence.

It is to be added that steps of the method in the embodiment 1 can be executed by the device in this embodiment.

It is to be noted that the various modules described above may be implemented by software or hardware. Implementation by hardware may, but may not necessarily, be performed in the following manners: the various modules described above are located in a same processor, or the various modules described above are located in their respective processors in any combination form.

Embodiment Three

According to another embodiment of the present invention, a processor is further provided. The processor is used for executing programs which, when executed, execute the method of any one of the optional embodiments described above.

Embodiment Four

According to another embodiment of the present invention, a storage medium is further provided. The storage medium includes stored programs which, when executed, execute the method of any one of the optional embodiments described above.

Apparently, it should be understood by those skilled in the art that each of the above-mentioned modules or steps of the present invention may be implemented by a general-purpose computing device, the modules or steps may be concentrated on a single computing device or distributed on a network composed of multiple computing devices, and alternatively, the modules or steps may be implemented by program codes executable by the computing devices, so that the modules or steps may be stored in a storage device and executed by the computing device. In some circumstances, the illustrated or described steps may be executed in sequences different from those described herein, or the modules or steps may be made into various integrated circuit modules separately, or multiple modules or steps therein may be made into a single integrated circuit module for implementation. In this way, the present invention is not limited to any specific combination of hardware and software.

The above are only preferred embodiments of the present invention and are not intended to limit the present invention. For those skilled in the art, the present invention may have various modifications and variations. Any modifications, equivalent substitutions, improvements and the like made within the spirit and principle of the present invention should fall within the scope of the present invention.

What is claimed is:

1. A low-density parity-check (LDPC) data encoding method, comprising:
obtaining an LDPC codeword sequence by performing LDPC encoding on an information packet bit sequence;
determining a size of a one-dimensional finite-length circular buffer according to the LDPC codeword sequence;
selecting a redundancy version value from a plurality of predetermined redundancy version values;
determining a starting position for reading a bit sequence to be transmitted in the one-dimensional finite-length circular buffer according to the selected redundancy version value, a lifting size, and a length of the information packet bit sequence;
forming the bit sequence to be transmitted by sequentially reading data bits with a specific length from the starting position; and
sending the bit sequence to be transmitted.

2. The method of claim 1,
wherein the LDPC codeword sequence is an interleaved LDPC codeword sequence that is obtained by interleaving the LDPC codeword sequence.

3. The method of claim 2, wherein the interleaved LDPC codeword sequence is obtained by:
performing block interleaving on the LDPC codeword sequence according to an interleaving matrix, wherein a number of rows of the interleaving matrix is determined according to a LDPC encoding parameter, and wherein the LDPC encoding parameter comprises at least one of the lifting size, the total number of columns of the base graph matrix, a total number of rows of the base graph matrix, or a number of system columns of the base graph matrix.

4. The method of claim 1, wherein the starting position corresponding to the redundancy version being $RV_i$ is calculated via the following formula:

$$S_i = \alpha \times \text{function}(\beta \times (nb/G) \times RV_i + \chi) \times Z + \delta; \quad \text{a first formula}$$

wherein in the first formula, nb is the total number of columns of the base graph matrix, Z is the lifting size, $\alpha$ is a positive integer, G is a real number greater than 0, $\beta$ is a positive real number, $\chi$ is a nonnegative real number, and $\delta$ is an integer,
wherein the function(x) represents rounding a real number x up to, or down to, or to a nearest integer; or $$S_i = \alpha \times (\beta \times \text{function}(\chi \times nb/G) \times RV_i + \chi) \times Z + \delta; \quad \text{a second formula}$$

wherein, in the second formula, nb is the total number of columns of the base graph matrix, Z is the lifting size, $\alpha$ is a positive integer, G is a real number greater than 0, $\beta$ is a positive integer, $\Delta$ is a positive real number, $\chi$ is a nonnegative real number, and $\delta$ is an integer,
wherein the function(x) represents rounding the real number x up to, or down to, or to a nearest integer; or $$S_i = \alpha \times (\beta \times \text{funtion}(\lambda \times nb \times Z/G) \times RV_i + \chi) + \delta; \quad \text{a third formula}$$

wherein, in the third formula, nb is the total number of columns of the base graph matrix, Z is the lifting size, G is a real number greater than 0, $\alpha$ is a positive integer, $\beta$ is a positive integer, $\Delta$ is a positive real number, $\chi$ is a nonnegative real number, and $\delta$ is an integer,
wherein the function(x) represents rounding the real number x up to, or down to, or to a nearest integer.

5. The method of claim 2, wherein the interleaving the LDPC codeword sequence to obtain the interleaved LDPC codeword sequence comprises:

interleaving all bits from an S0-th bit to an S1-th bit in the LDPC codeword sequence, wherein S0 and S1 are positive integers, and S1 is greater than the S0.

6. The method of claim 5, wherein the interleaving the all bits from the S0-th bit to the S1-th bit in the LDPC codeword sequence comprises:
performing block interleaving on the all bits from the S0-th bit to the S1-th bit in the LDPC codeword sequence according to an interleaving matrix, wherein a total number of columns of the interleaving matrix is Z0, wherein Z0 is determined by a LDPC encoding parameter, and wherein the LDPC encoding parameter comprises at least one of the lifting size, the total number of columns of the base graph matrix, a total number of rows of the base graph matrix, a number of system columns of the base graph matrix, or a length of the information packet bit sequence.

7. The method of claim 6, wherein Z0 is determined by following parameters: S0, S1 and a modulation order, wherein the modulation order is a number of bits carried by each modulation symbol.

8. The method of claim 7, wherein Z0 is calculated via the following formula: $Z0=\text{function}(\alpha \times (S1-S0+1)/M+\delta)$, wherein M is a positive integer, $\alpha$ is a positive real number, $\delta$ is a nonnegative integer, and wherein the function(x) represents rounding the real number x up to, or down to, or to a nearest integer.

9. The method of claim 1, wherein the sending the bit sequence to be transmitted comprises:
dividing the bit sequence to be transmitted into a plurality of bit packets, interleaving bits in each bit packet of the plurality of bit packets respectively, and mapping each interleaved bit packet to a constellation modulation symbol.

10. An apparatus comprising a processor, which is configured to execute programs, wherein, when executed, the programs execute a method comprising:
obtain a low-density parity-check (LDPC) codeword sequence by being configured to perform LDPC encoding on an information packet bit sequence;
determine a size of a one-dimensional finite-length circular buffer according to the LDPC codeword sequence;
select a redundancy version value from a plurality of predetermined redundancy version values;
determine a starting position for reading a bit sequence to be transmitted in the one-dimensional finite-length circular buffer according to the selected redundancy version value, a lifting size, and a length of the information packet bit sequence;
form the bit sequence to be transmitted by being configured to sequentially read data bits with a specific length from the starting position; and
send the bit sequence to be transmitted.

11. The apparatus of claim 10,
wherein the LDPC codeword sequence is an interleaved LDPC codeword sequence that is obtained by interleaving the LDPC codeword sequence.

12. The apparatus of claim 11, wherein the interleaved LDPC codeword sequence is obtained by the processor configured to:
perform block interleaving on the LDPC codeword sequence according to an interleaving matrix, wherein a number of rows of the interleaving matrix is determined according to a LDPC encoding parameter, and wherein the LDPC encoding parameter comprises at least one of the lifting size, the total number of columns of the base graph matrix, a total number of rows of the base graph matrix, or a number of system columns of the base graph matrix.

13. The apparatus of claim 10, wherein the starting position corresponding to the redundancy version being $RV_i$ is calculated via the following formula:

$$S_i = \alpha \times \text{function}(\beta \times (nb/G) \times RV_i + \chi) \times Z + \delta; \quad \text{a first formula}$$

wherein in the first formula, nb is the total number of columns of the base graph matrix, Z is the lifting size, $\alpha$ is a positive integer, G is a real number greater than 0, $\beta$ is a positive real number, $\chi$ is a nonnegative real number, and $\delta$ is an integer,
wherein the function(x) represents rounding a real number x up to, or down to, or to a nearest integer; or $$S_i = \alpha \times (\beta \times \text{function}(\chi \times nb/G) \times RV_i + \chi) \times Z + \delta; \quad \text{a second formula}$$

wherein, in the second formula, nb is the total number of columns of the base graph matrix, Z is the lifting size, a is a positive integer, G is a real number greater than 0, $\beta$ is a positive integer, $\lambda$ is a positive real number, $\chi$ is a nonnegative real number, and $\delta$ is an integer,
wherein the function(x) represents rounding the real number x up to, or down to, or to a nearest integer; or $$S_i = \alpha \times (\beta \times \text{funtion}(\lambda \times nb \times Z/G) \times RV_i + \chi) + \delta; \quad \text{a third formula}$$

wherein, in the third formula, nb is the total number of columns of the base graph matrix, Z is the lifting size, G is a real number greater than 0, $\alpha$ is a positive integer, $\beta$ is a positive integer, $\lambda$ is a positive real number, $\chi$ is a nonnegative real number, and $\delta$ is an integer,
wherein the function(x) represents rounding the real number x up to, or down to, or to a nearest integer.

14. The apparatus of claim 11, wherein the interleave the LDPC codeword sequence to obtain the interleaved LDPC codeword sequence comprises:
interleave all bits from an S0-th bit to an S1-th bit in the LDPC codeword sequence, wherein S0 and S1 are positive integers, and S1 is greater than the S0.

15. The apparatus of claim 14, wherein the interleave the all bits from the S0-th bit to the S1-th bit in the LDPC codeword sequence comprises:
perform block interleaving on the all bits from the S0-th bit to the S1-th bit in the LDPC codeword sequence according to an interleaving matrix, wherein a total number of columns of the interleaving matrix is Z0, wherein Z0 is determined by a LDPC encoding parameter, and wherein the LDPC encoding parameter comprises at least one of the lifting size, the total number of columns of the base graph matrix, a total number of rows of the base graph matrix, a number of system columns of the base graph matrix, or a length of the information packet bit sequence.

16. The apparatus of claim 15, wherein Z0 is determined by following parameters: S0, S1 and a modulation order, wherein the modulation order is a number of bits carried by each modulation symbol.

17. The apparatus of claim 16, wherein Z0 is calculated via the following formula: $Z0 = \text{function}(\alpha \times (S1-S0+1)/M + \delta)$, wherein M is a positive integer, $\alpha$ is a positive real number, $\delta$ is a nonnegative integer, and wherein the function (x) represents rounding the real number x up to, or down to, or to a nearest integer.

18. The apparatus of claim 10, wherein the send the bit sequence to be transmitted comprises:
divide the bit sequence to be transmitted into a plurality of bit packets, interleave bits in each bit packet of the plurality of bit packets respectively, and the each interleaved bit packet to a constellation modulation symbol.

19. A non-transitory storage medium, comprising stored programs, wherein, when executed, the programs execute a method comprising:
  obtaining a low-density parity-check (LDPC) codeword sequence by being configured to perform LDPC encoding on an information packet bit sequence;
  determining a size of a one-dimensional finite-length circular buffer according to the LDPC codeword sequence;
  selecting a redundancy version value from a plurality of predetermined redundancy version values;
  determining a starting position for reading a bit sequence to be transmitted in the one-dimensional finite-length circular buffer according to the selected redundancy version value, a lifting size, and a length of the information packet bit sequence;
  forming the bit sequence to be transmitted by being configured to sequentially read data bits with a specific length from the starting position; and
  sending the bit sequence to be transmitted.

20. The non-transitory storage medium of claim 19,
  the LDPC codeword sequence is an interleaved LDPC codeword sequence that is obtained by interleaving the LDPC codeword sequence.

* * * * *